(12) United States Patent
Hayashi et al.

(10) Patent No.: US 10,872,934 B2
(45) Date of Patent: Dec. 22, 2020

(54) DISPLAY DEVICE AND MANUFACTURING METHOD THEREOF

(71) Applicant: Japan Display Inc., Tokyo (JP)

(72) Inventors: Shuji Hayashi, Tokyo (JP); Hayato Kurasawa, Tokyo (JP); Takayuki Nakanishi, Tokyo (JP); Mitsuhide Miyamoto, Tokyo (JP); Hiroshi Mizuhashi, Tokyo (JP); Yoshitoshi Kida, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/617,107

(22) Filed: Jun. 8, 2017

(65) Prior Publication Data

US 2018/0006094 A1    Jan. 4, 2018

(30) Foreign Application Priority Data

Jul. 1, 2016   (JP) .................................. 2016-131303

(51) Int. Cl.
    *H01L 27/32*   (2006.01)
    *G06F 3/041*   (2006.01)
    *G06F 3/044*   (2006.01)

(52) U.S. Cl.
    CPC ............ *H01L 27/323* (2013.01); *G06F 3/044* (2013.01); *G06F 3/0412* (2013.01); *G06F 2203/04103* (2013.01)

(58) Field of Classification Search
    CPC . H01L 27/323; H01L 51/5225; G06F 3/0412; G06F 3/044
    See application file for complete search history.

(56) References Cited

U.S. PATENT DOCUMENTS

| | | | |
|---|---|---|---|
| 2004/0217945 A1 | 11/2004 | Miyamoto et al. | |
| 2005/0190329 A1* | 9/2005 | Okumura | G02F 1/1323 349/123 |
| 2006/0226422 A1* | 10/2006 | Millard | H01L 27/3223 257/40 |

(Continued)

FOREIGN PATENT DOCUMENTS

| | | |
|---|---|---|
| CN | 104516585 A | 4/2015 |
| JP | 2000-331784 A | 11/2000 |

(Continued)

OTHER PUBLICATIONS

Taiwanese Office Action dated Apr. 12, 2018 for corresponding Taiwanese application No. 106116087, with partial translation.

(Continued)

*Primary Examiner* — Ariel A Balaoing
(74) *Attorney, Agent, or Firm* — Michael Best & Friedrich LLP

(57) ABSTRACT

Disclosed is a display device including: a plurality of pixel electrodes; a plurality of opposing electrodes located over the plurality of pixel electrodes and arranged in a stripe shape; and an EL layer sandwiched between the plurality of pixel electrodes and the plurality of opposing electrodes. The plurality of opposing electrodes is electrically independent from one another. Each of the opposing electrodes may be electrically independent from the plurality of metal films. The plurality of metal films may be electrically floating.

4 Claims, 26 Drawing Sheets

(56) References Cited

U.S. PATENT DOCUMENTS

| | | | |
|---|---|---|---|
| 2008/0211395 A1* | 9/2008 | Koshihara | G06F 3/044 313/504 |
| 2009/0058265 A1* | 3/2009 | Komatsu | C09K 11/565 313/503 |
| 2012/0050193 A1 | 3/2012 | Noguchi et al. | |
| 2012/0205678 A1 | 8/2012 | Ikeda et al. | |
| 2012/0217516 A1 | 8/2012 | Hatano et al. | |
| 2012/0228603 A1* | 9/2012 | Nakamura | H01L 51/5234 257/40 |
| 2012/0249401 A1 | 10/2012 | Omoto | |
| 2013/0069894 A1 | 3/2013 | Chen et al. | |
| 2013/0314372 A1 | 11/2013 | Chang et al. | |
| 2014/0063385 A1* | 3/2014 | Yang | G06F 3/044 349/15 |
| 2014/0111404 A1 | 4/2014 | Omata et al. | |
| 2014/0253493 A1 | 9/2014 | Cho | |
| 2015/0060817 A1 | 3/2015 | Sato et al. | |
| 2015/0097808 A1 | 4/2015 | Roh et al. | |
| 2015/0187272 A1 | 7/2015 | Kimura et al. | |
| 2016/0132180 A1* | 5/2016 | Kao | G06F 3/044 345/174 |
| 2016/0313837 A1 | 10/2016 | Zhu et al. | |

FOREIGN PATENT DOCUMENTS

| | | |
|---|---|---|
| JP | 2007-095611 A | 4/2007 |
| JP | 2008-216543 A | 9/2008 |
| JP | 2009-032673 A | 2/2009 |
| JP | 2011-165563 A | 8/2011 |
| JP | 2011-222178 A | 11/2011 |
| JP | 2012-208263 A | 10/2012 |
| JP | 2013-065301 A | 4/2013 |
| JP | 2014-041774 A | 3/2014 |
| JP | 2015-018331 A | 1/2015 |
| JP | 2015-050245 A | 3/2015 |
| KR | 10-2012-0019366 A | 3/2012 |
| KR | 10-2012-0092508 A | 8/2012 |
| KR | 10-2013-0056497 A | 5/2013 |
| KR | 10-2014-0050559 A | 4/2014 |
| KR | 10-2014-0052969 A | 5/2014 |
| KR | 10-2015-0039933 A | 4/2015 |
| KR | 10-2015-0077328 A | 7/2015 |
| TW | I225219 B | 12/2004 |
| TW | 201611680 A | 3/2016 |
| TW | 201624251 A | 7/2016 |
| WO | 2008/044369 A1 | 4/2008 |
| WO | 2013/140632 A1 | 9/2013 |
| WO | 2015/096764 A1 | 7/2015 |

OTHER PUBLICATIONS

Korean Office Action dated Oct. 18, 2018 for the corresponding Korean patent application No. 10-2017-0073852, With Partial English Translation.
Taiwanese Office Action dated Apr. 12, 2018 for corresponding Taiwanese application No. 10611608, with partial translation.
Korean Office Action dated Dec. 17, 2018 for the corresponding Korean Application No. 10-2017-0075773, Voluntarily submitting with partial English machine translation.
Korean Office Action dated Jun. 28, 2019 for the corresponding Korean Application No. 10-2017-0075773, Voluntarily submitting with partial English machine translation.
Korean Office Action dated Dec. 17, 2018 for the corresponding Korean Application No. 10-2017-0123326, Voluntarily submitting with partial English machine translation.
Korean Office Action dated Jun. 28, 2019 for the corresponding Korean Application No. 10-2017-0123326, Voluntarily submitting with partial English machine translation.
Korean Office Action dated Apr. 17, 2019 for the corresponding Korean patent application No. 10-2017-0073852, with partial English machine translation.
Korean Office Action dated Oct. 27, 2019 for the Korean application No. 10-2017-0073852, with partial English machine translation.
Chinese Office Action dated Jan. 15, 2020 for the Chinese application No. 201710456175.7, with partial English machine translation.
Korean Office Action dated Feb. 15, 2020 for the corresponding Korean application No. 10-2019-0153367, with English machine translation.
Japanese Office Action dated Mar. 10, 2020 for the corresponding Japanese application No. 2016-131303, with English machine translation retrieved from Global Dossier.

* cited by examiner

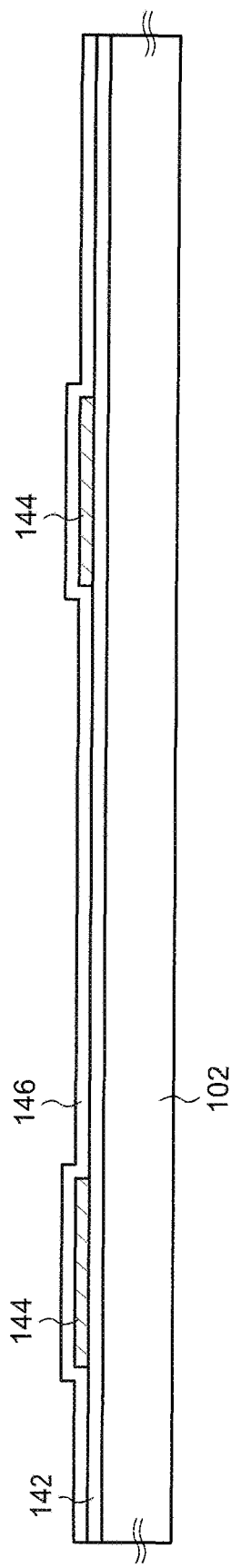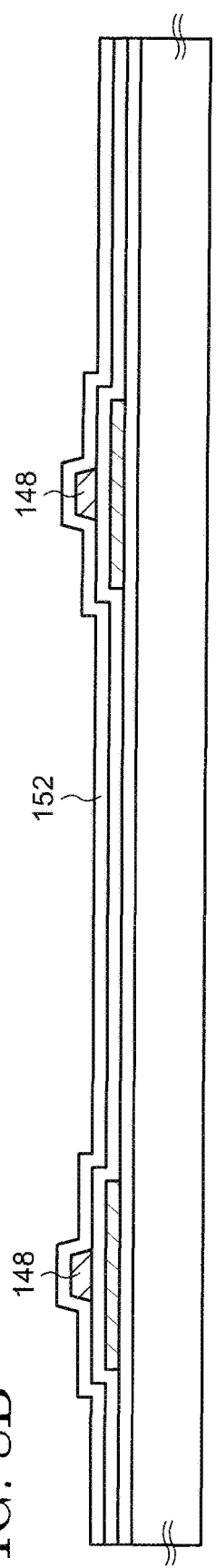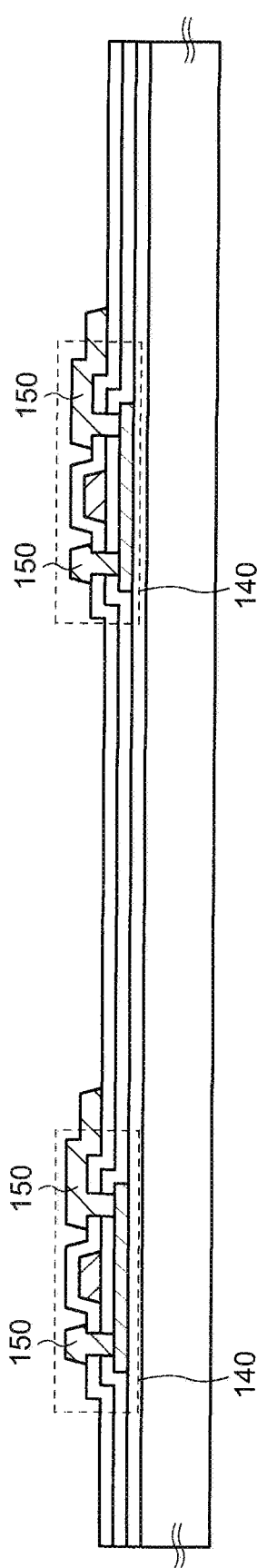

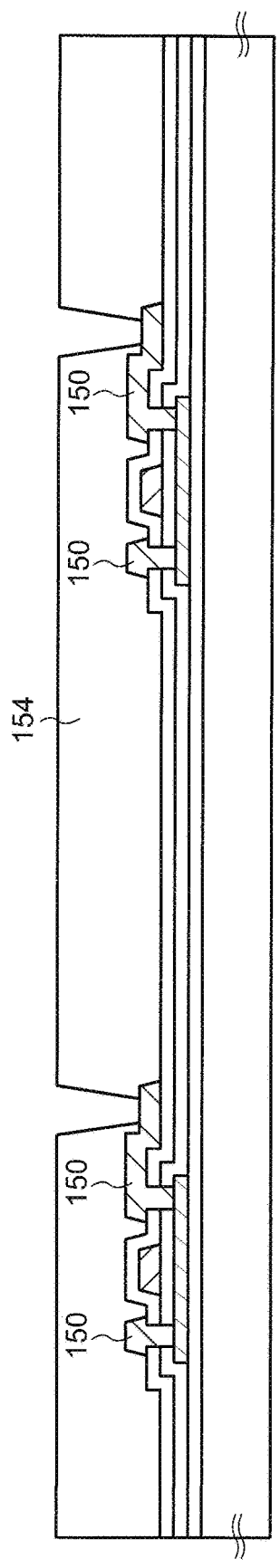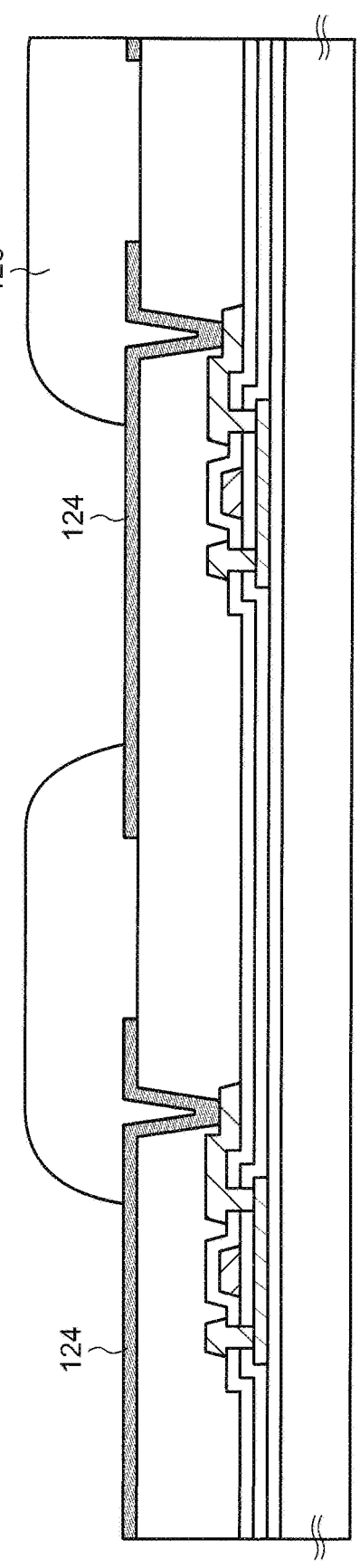

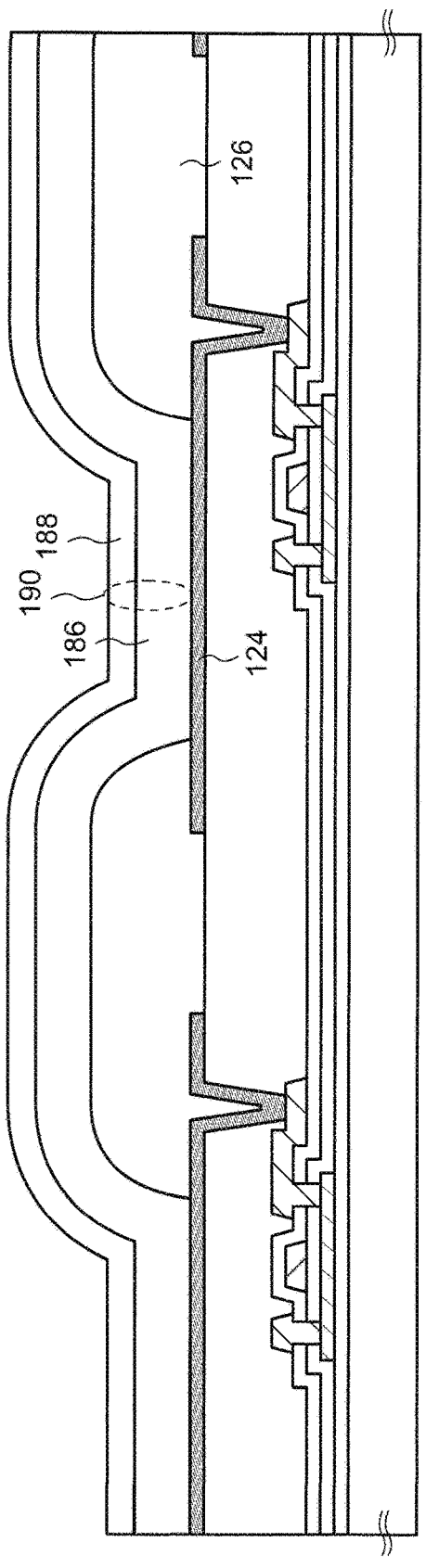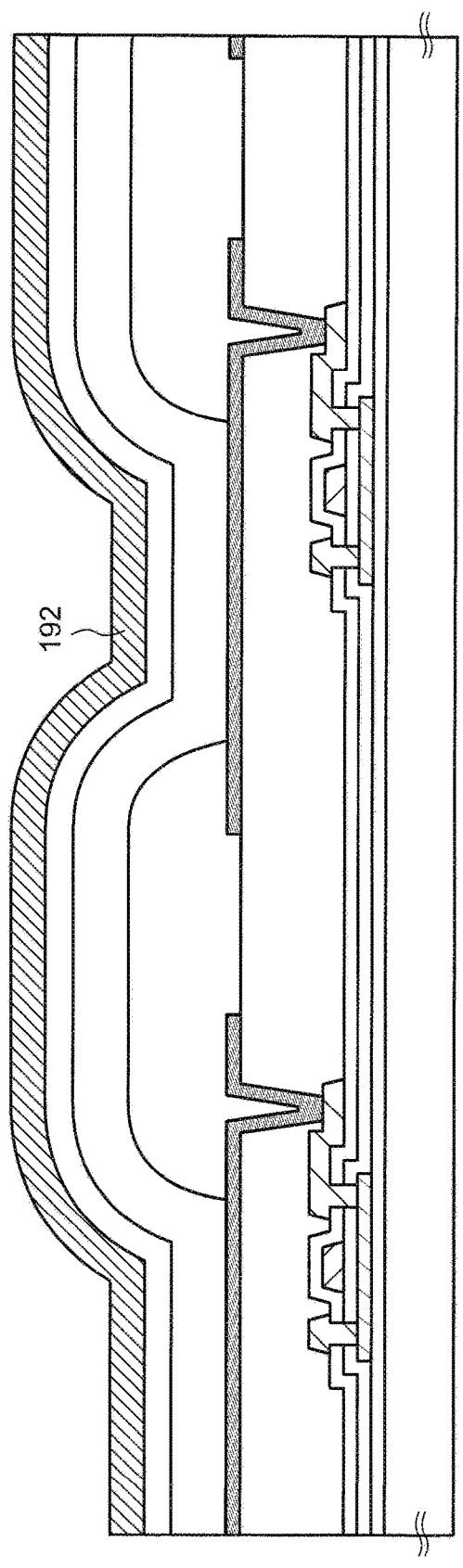

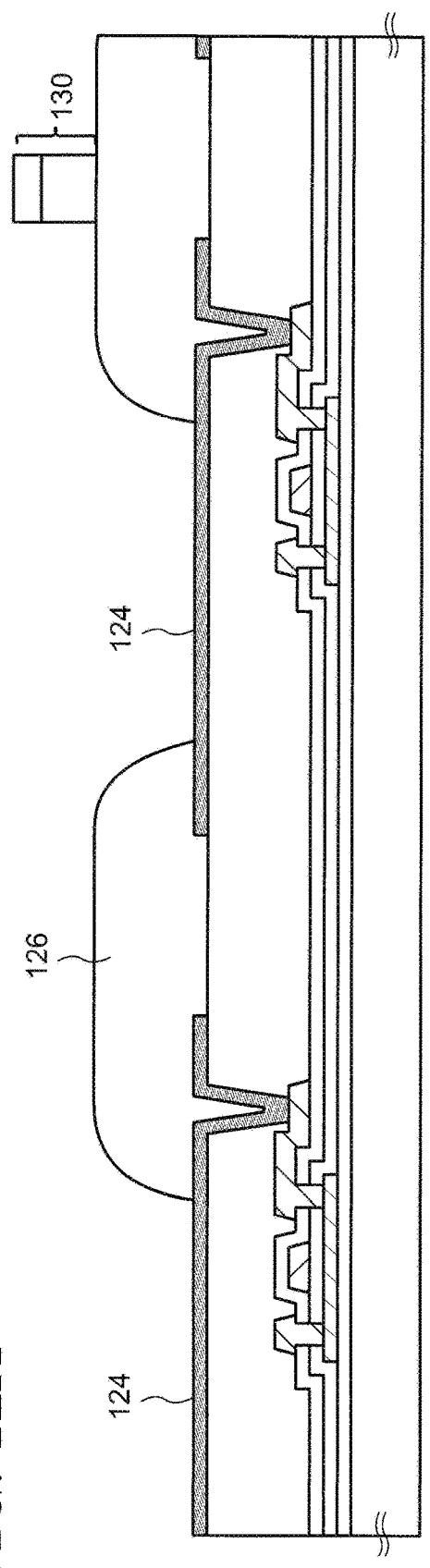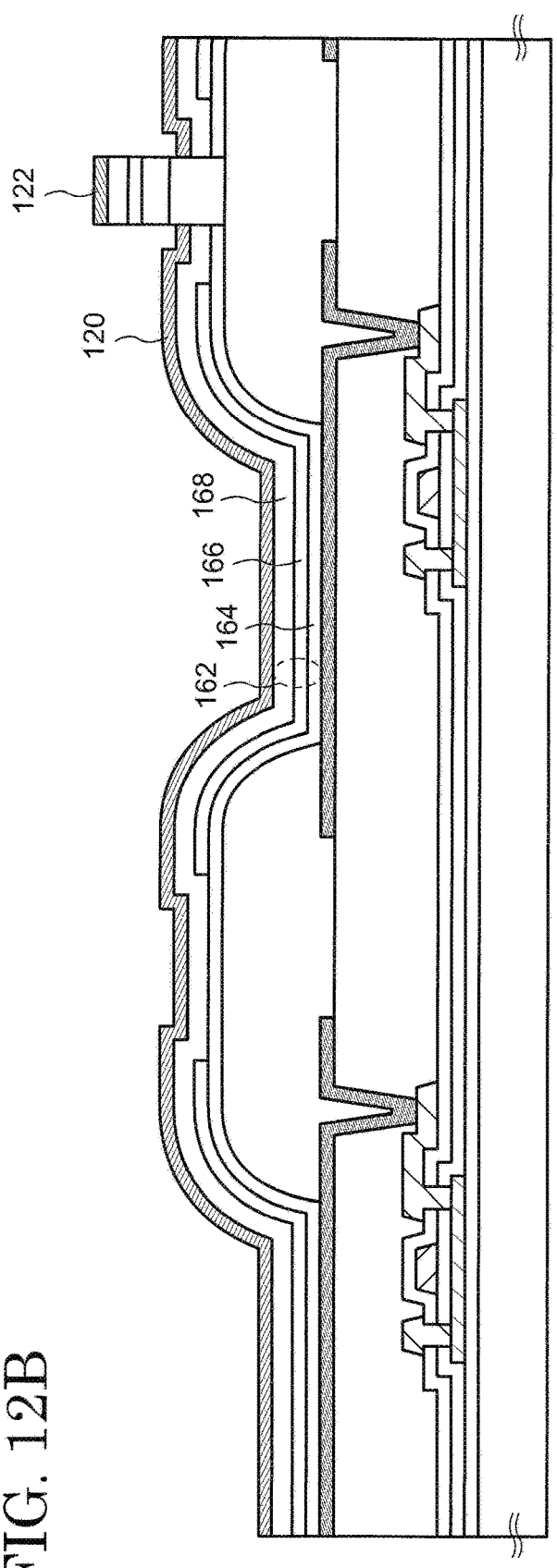

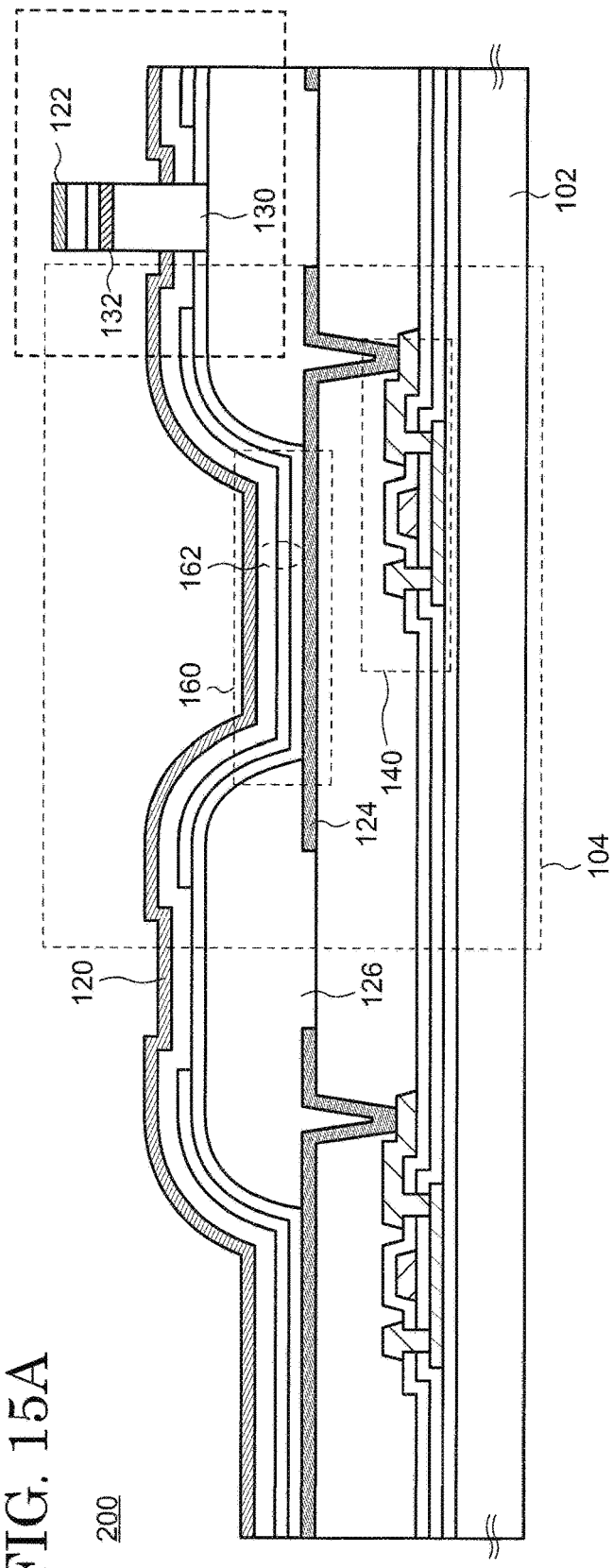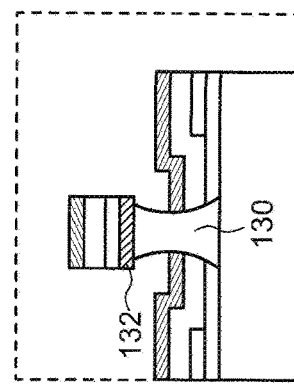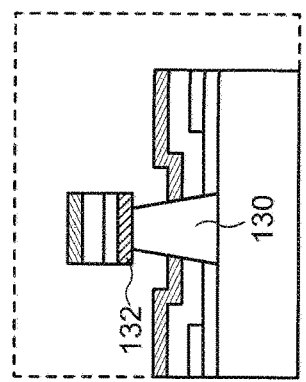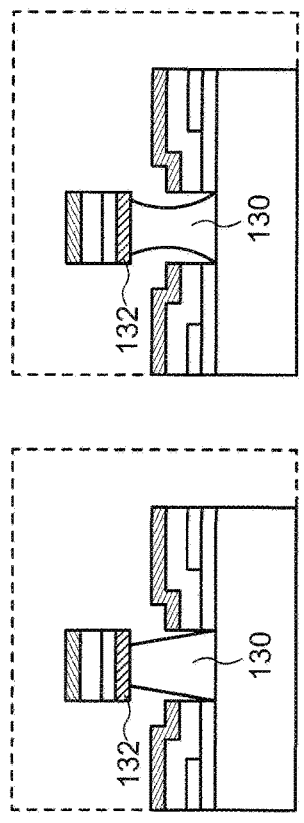

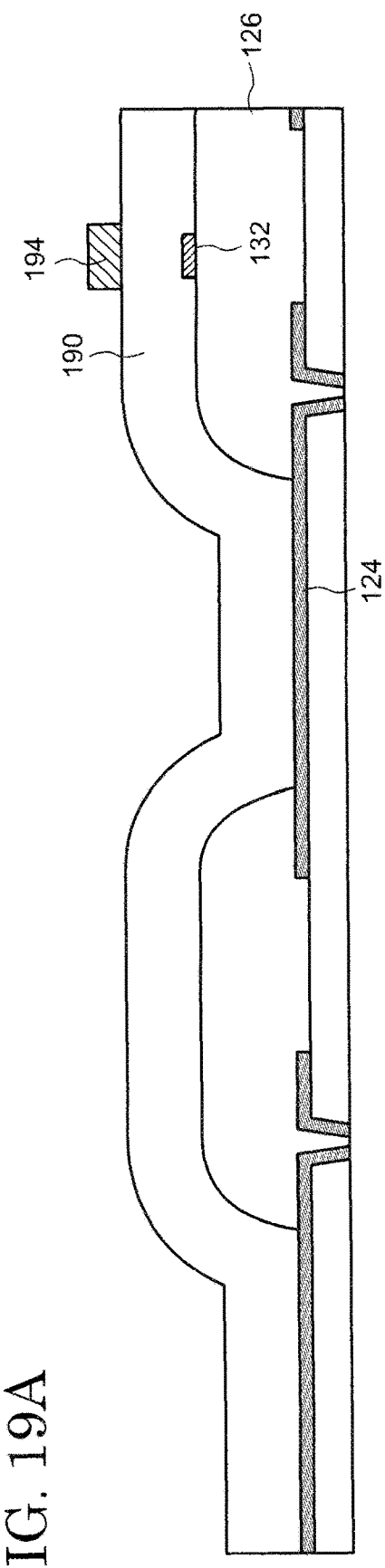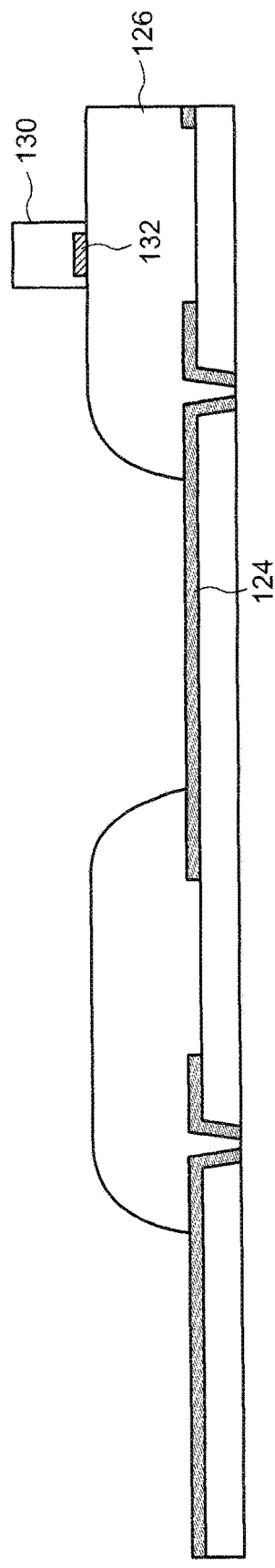

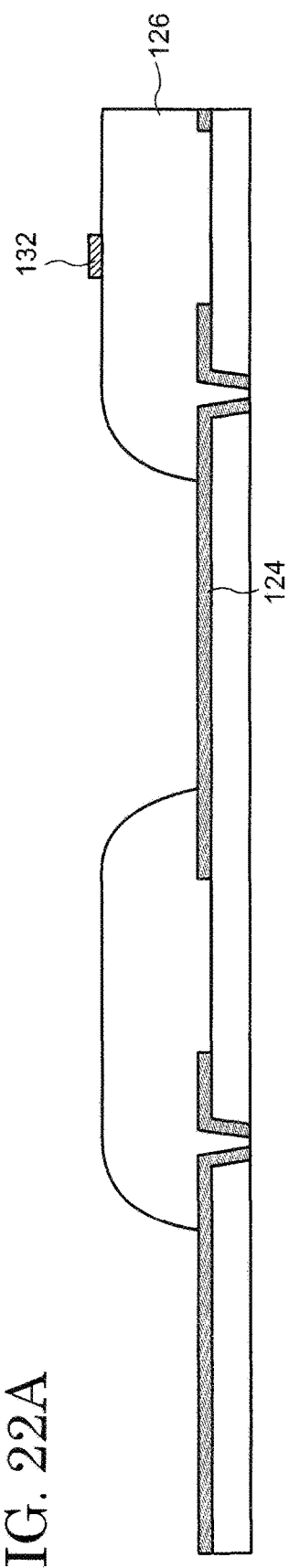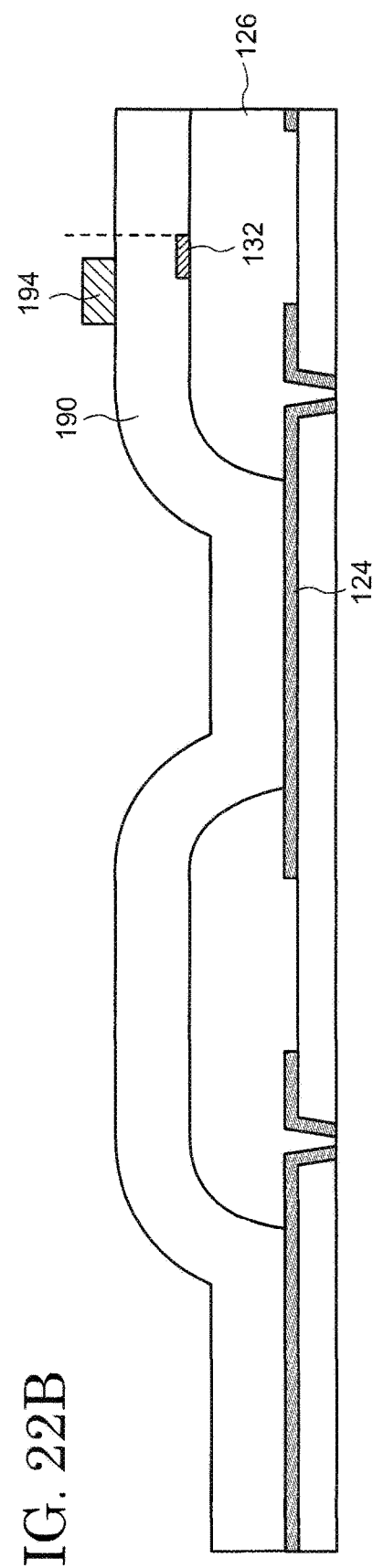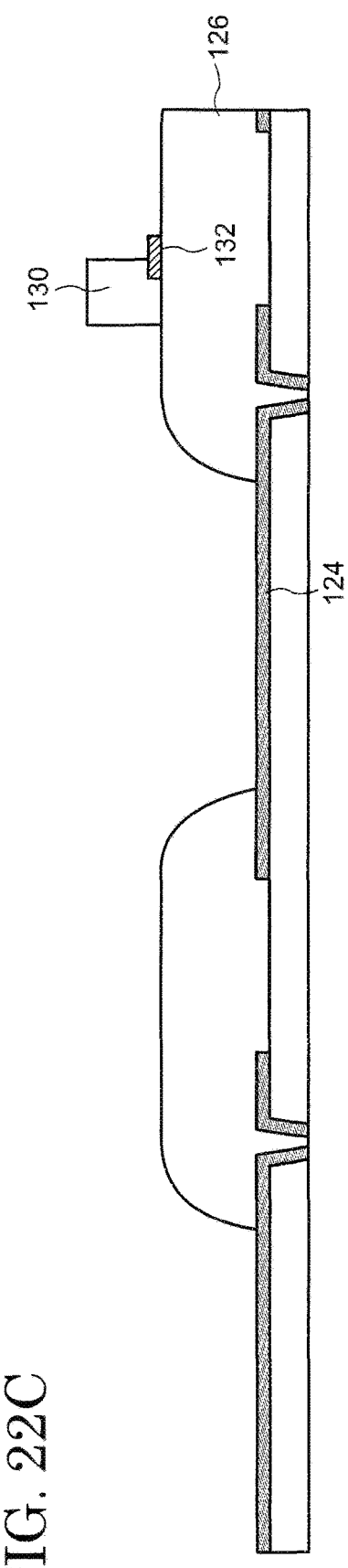

FIG. 23
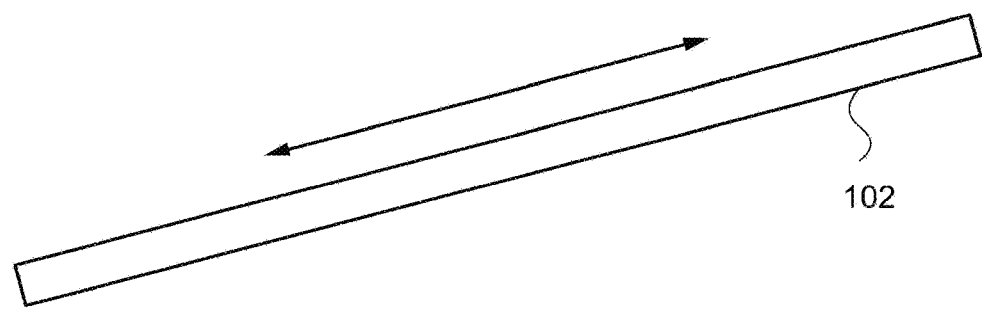
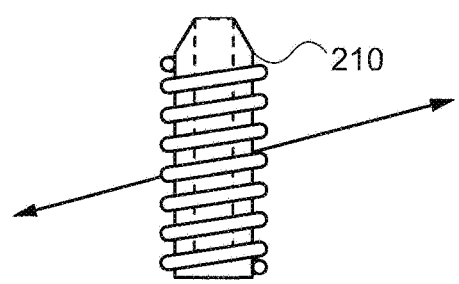

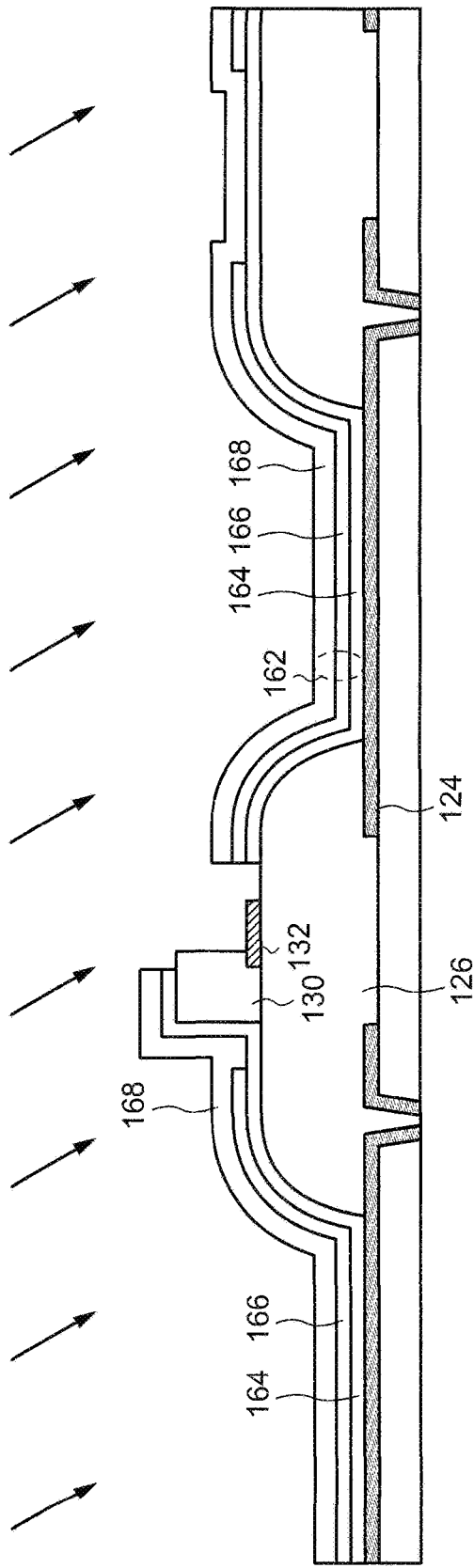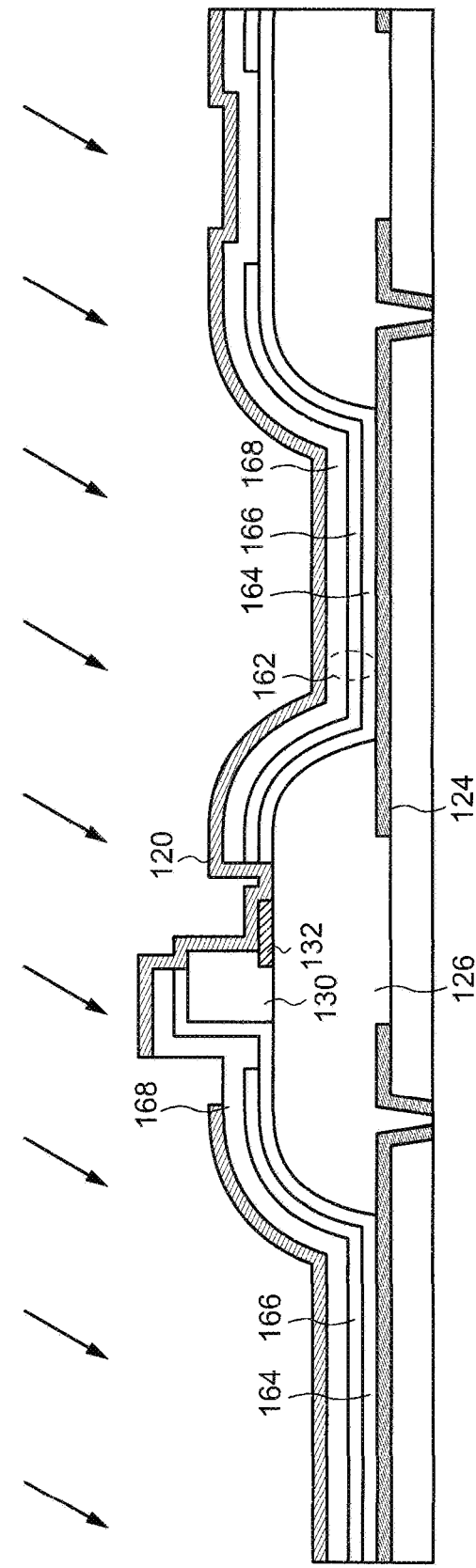

DISPLAY DEVICE AND MANUFACTURING METHOD THEREOF

CROSS REFERENCE TO RELATED APPLICATIONS

This application is based on and claims the benefit of priority from the prior Japanese Patent Application No. 2016-131303, filed on Jul. 1, 2016, the entire contents of which are incorporated herein by reference.

FIELD

An embodiment of the present invention relates to a display device such as an organic EL display device and a manufacturing method thereof. For example, an embodiment of the present invention relates to a display device on which a touch panel is mounted and a manufacturing method thereof.

BACKGROUND

A touch panel has been known as an interface for a user to input information to a display device. Arrangement of a touch panel over a screen of a display device allows a user to operate input buttons, icons, and the like displayed on a screen, by which information can be readily input to a display device. For example, Japanese patent application publications No. 2015-18331 and No. 2015-50245 disclose an electronic apparatus in which a touch panel is mounted over an organic EL (Electroluminescence) display device.

SUMMARY

An embodiment of the present invention is a display device including: a plurality of pixel electrodes; a plurality of opposing electrodes located over the plurality of pixel electrodes and arranged in a stripe shape; and an EL layer sandwiched between the plurality of pixel electrodes and the plurality of opposing electrodes. The plurality of opposing electrodes is electrically independent from one another.

An embodiment of the present invention is a display device including: a first pixel and a second pixel adjacent to each other in a display region and each possess a pixel electrode, an EL layer over the pixel electrode, and an opposing electrode over the EL layer; a first insulating film covering edges of the pixel electrodes of the first pixel and the second pixel and sandwiched between the pixel electrode and the EL layer in the first pixel and the second pixel; and a structural member over and in contact with the first insulating film, the structural member being located between the opposing electrodes of the first pixel and the second pixel. The opposing electrodes of the first pixel and the second pixel are electrically separated from each other.

An embodiment of the present invention is a display device including: a first pixel and a second pixel adjacent to each other in a display region and each possess a pixel electrode, an EL layer over the pixel electrode, and an opposing electrode over the EL layer; and a first insulating film covering edges of the pixel electrodes of the first pixel and the second pixel and sandwiched between the pixel electrode and the EL layer in the first pixel and the second pixel. The first insulating film has a trench sandwiched between the opposing electrodes of the first pixel and the second pixel. The opposing electrodes of the first pixel and the second pixel are electrically separated from each other.

An embodiment of the present invention is a manufacturing method of a display device. The manufacturing method includes: forming a first pixel electrode and a second pixel electrode adjacent to each other; forming a first insulating film so as to cover edges of the first pixel electrode and the second pixel electrode; forming a structural member over the first insulating film, the structural member including at least one of an organic insulator and an inorganic insulator; forming an EL layer over the first pixel electrode, the second pixel electrode, the first insulating film, and the structural member; and forming an opposing electrode over the first pixel electrode and an opposing electrode over the second pixel electrode by forming a conductive film over the EL layer.

An embodiment of the present invention is a manufacturing method of a display device. The manufacturing method includes: forming a first pixel electrode and a second pixel electrode adjacent to each other; forming a first insulating film so as to cover edges of the first pixel electrode and the second pixel electrode; forming a trench in the first insulating film; forming an EL layer over the first pixel electrode, the second pixel electrode, the first insulating film, and the trench; and respectively forming a first opposing electrode and a second opposing electrode over the first pixel electrode and the second pixel electrode by forming a conductive film over the EL layer so as to sandwich the trench.

BRIEF DESCRIPTION OF DRAWINGS

FIG. 8A to FIG. 8C are schematic cross-sectional views showing a manufacturing method of a display device of an embodiment of the present invention;

FIG. 9A and FIG. 9B are schematic cross-sectional views showing a manufacturing method of a display device of an embodiment of the present invention;

FIG. 10A and FIG. 10B are schematic cross-sectional views showing a manufacturing method of a display device of an embodiment of the present invention;

FIG. 12A and FIG. 12B are schematic cross-sectional views showing a manufacturing method of a display device of an embodiment of the present invention;

FIG. 15A to FIG. 15E are schematic cross-sectional views of a display device of an embodiment of the present invention;

FIG. 19A and FIG. 19B are schematic cross-sectional views showing a manufacturing method of a display device of an embodiment of the present invention;

FIG. 22A to FIG. 22C are schematic cross-sectional views showing a manufacturing method of a display device of an embodiment of the present invention;

FIG. 23 is schematic drawing showing a manufacturing method of a display device of an embodiment of the present invention;

FIG. 24A and FIG. 24B are schematic cross-sectional views showing a manufacturing method of a display device of an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

<First Embodiment>

In the present embodiment, a structure of a display device 100 of an embodiment of the present invention is explained by using FIG. 1 to FIG. 7.

Figure 1:
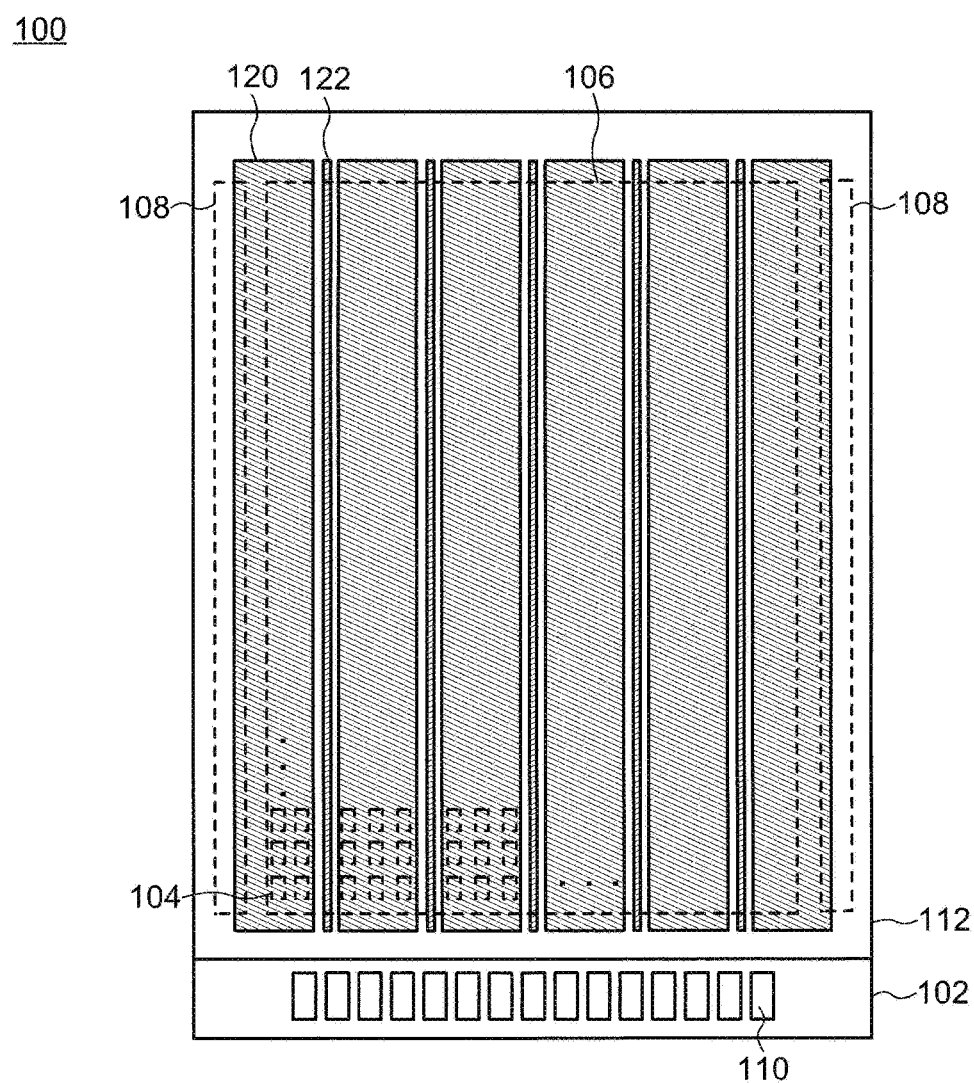
FIG. 1 is a schematic top view of a display device of an embodiment of the present invention.

A top view schematically showing the display device according to the present embodiment is shown in FIG. 1. The display device 100 possesses a display region 106 including a plurality of pixels 104 arranged in a row direction and a column direction and driver circuits 108 over one surface (top surface) of a substrate 102. The display region 106 and the driver circuits 108 are disposed between the substrate 102 and an opposing substrate 112. A variety of wirings (not shown) extend to a side surface of the substrate 102 from the display region 106 and the driver circuits 108 and is exposed at an edge of the substrate 102, and the exposed portions form terminals 110. The terminals 110 are connected to a connector (not shown) such as a flexible printed circuit (FPC). Image signals supplied from an external circuit are provided to the pixels 104 through the driver circuits 108 by which display elements in the pixels 104 are controlled and an image is displayed on the display region 106. In FIG. 1, two driver circuits 108 are arranged to sandwich the display region 106. However, a single driver circuit 108 may be used. The driver circuits 108 may not be necessarily formed over the substrate 102, and a driver circuit formed over a different substrate may be formed over the substrate 102 or the connector.

The plurality of pixels 104 can be provided with display elements such as light-emitting elements or liquid crystal elements giving different colors from one another, thereby achieving full-color display. For example, display elements respectively providing red, green, and blue colors can be arranged in the respective three pixels 104. Alternatively, display elements providing white color may be used in all of the pixels 104, and full-color display may be carried out by extracting red, green, and blue colors from the respective pixels 104 with a color filter. An arrangement of the pixels 104 is also not limited, and a stripe arrangement, a delta arrangement, a Pentile arrangement, or the like may be employed.

As described below, a pixel electrode and an EL layer over the pixel electrode are provided to each pixel 104. As shown in FIG. 1, opposing electrodes 120 arranged in a stripe shape are formed over the EL layer to structure light-emitting elements with the pixel electrodes and the EL layer.

Figure 2:
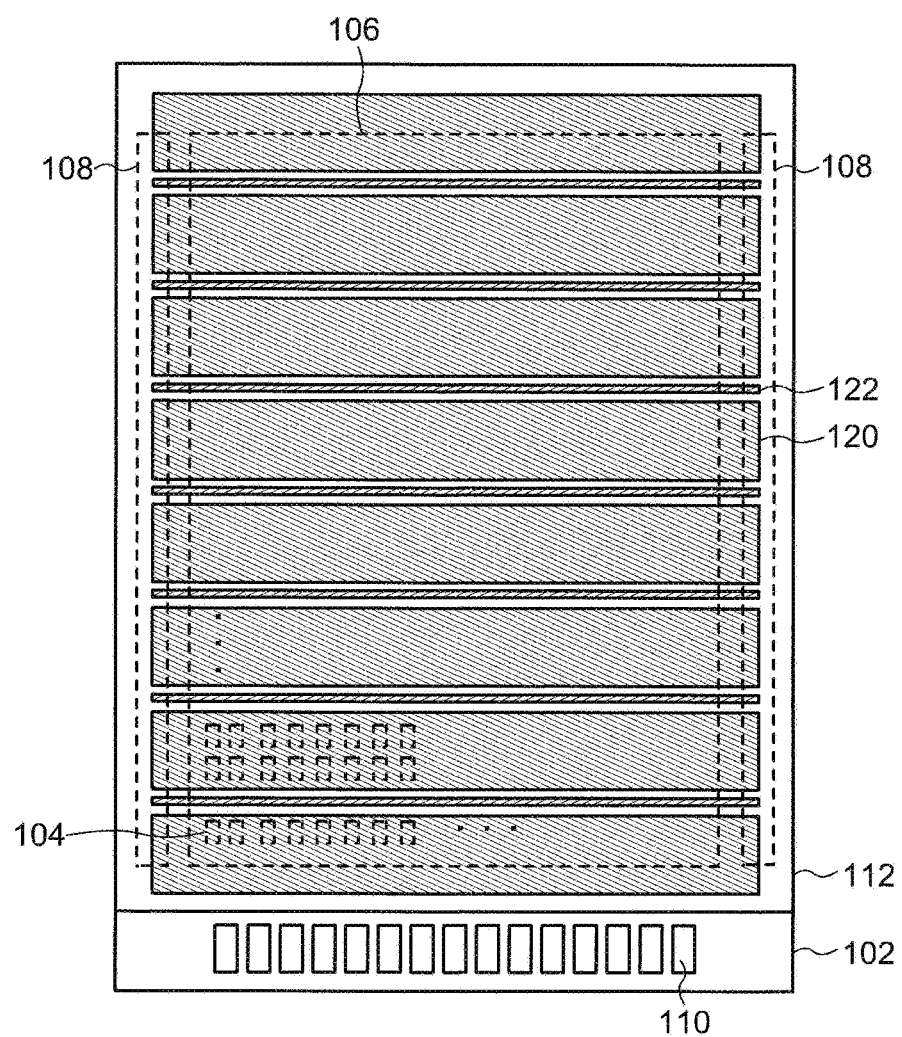
FIG. 2 is a schematic top view of a display device of an embodiment of the present invention.

The display device 100 may further possess a plurality of first conductive films 122 arranged in a stripe shape. In this case, the opposing electrodes 120 and the first conductive films 122 are alternately arranged. For example, one first conductive film 122 is sandwiched by two adjacent opposing electrodes 120 as shown in FIG. 1. In a similar way, one opposing electrode 120 other than the terminal opposing electrodes 120 is sandwiched by two adjacent first conductive films 122. These opposing electrodes 120 and the first conductive films 122 may be arranged so as to extend in a direction parallel to a side of the display region 106. In FIG. 1, for example, the opposing electrodes 120 and the first conductive films 122 extend in a direction parallel to a long side direction of the display region 106. Alternatively, as shown in FIG. 2, the opposing electrodes 120 and the first conductive films 122 may be arranged so as to extend in a direction parallel to the short side.

The plurality of pixels 104 are each covered by one of the opposing electrodes 120. In other words, one opposing electrode 120 can be provided so as to cover multiple pixels 104 among the plurality of pixels 104. For example, when the opposing electrodes 120 extend in a first direction parallel to the long side (FIG. 1), the opposing electrodes 120 can be arranged so as to cover not only multiple pixels 104 arranged in the first direction but also multiple pixels 104 arranged in a direction perpendicular to the first direction. In FIG. 1, the second opposing electrode 120 from the left covers multiple pixels 104 arranged in three columns in the first direction. On the other hand, the first conductive film 122 may be disposed so as not to overlap any of the plurality of pixels 104. Note that, as shown in FIG. 1, the terminal opposing electrodes 120 may be arranged so as to overlap with a part of or all of the driver circuits 108. Alternatively, all of the plurality of opposing electrodes 120 may be arranged so as to overlap with a part of or all of the driver circuits 108 as shown in FIG. 2.

Two adjacent opposing electrodes 120 are separated with one first conductive film 122 sandwiched therebetween. Thus, the plurality of opposing electrodes 120 can be configured to be electrically independent from one another. In this case, the opposing electrodes 120 may be simultaneously applied with the same potential or different potentials.

Similarly, two first conductive films 122 adjacent to each other are separated with one opposing electrode 120 sandwiched therebetween. Hence, the first conductive films 122 can be configured so as to be electrically independent from one another. In this case, the first conductive films 122 may be configured to be electrically floating or simultaneously applied with different potentials.

Note that the opposing electrodes 120 and the first conductive films 122 may be physically separated and electrically independent from each other.

Figure 3A:
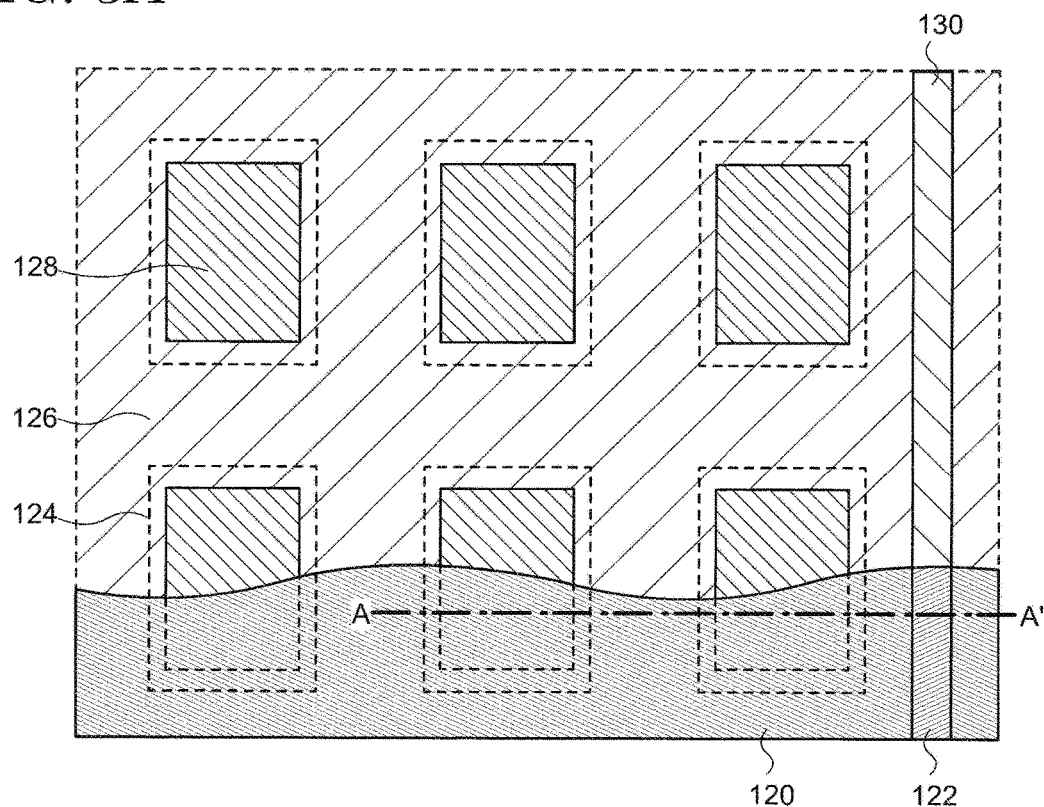
FIG. 3A and FIG. 3B are respectively a schematic top view and perspective view of a display device of an embodiment of the present invention.
Figure 3B:
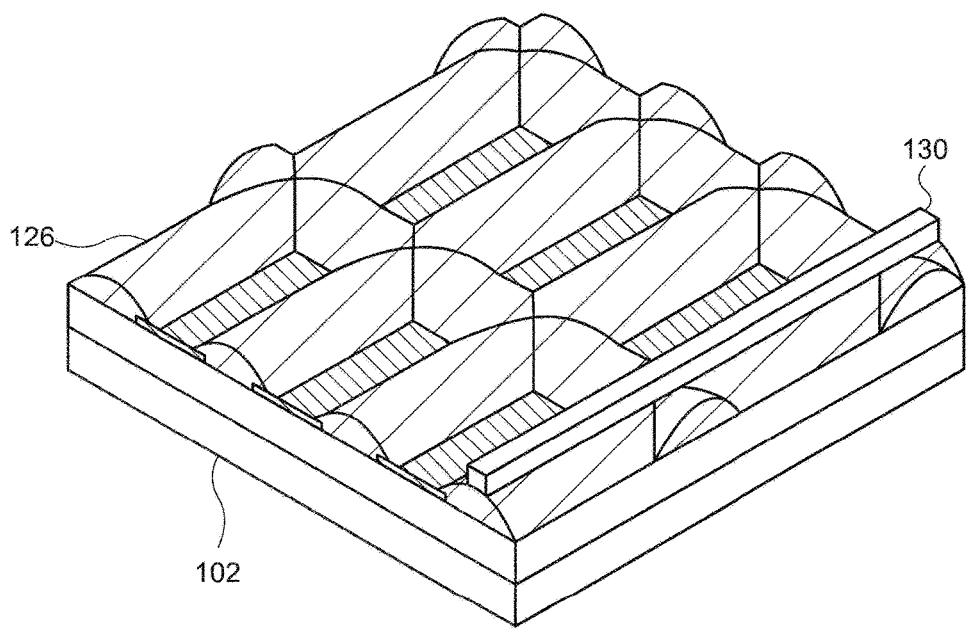
Figure 4:
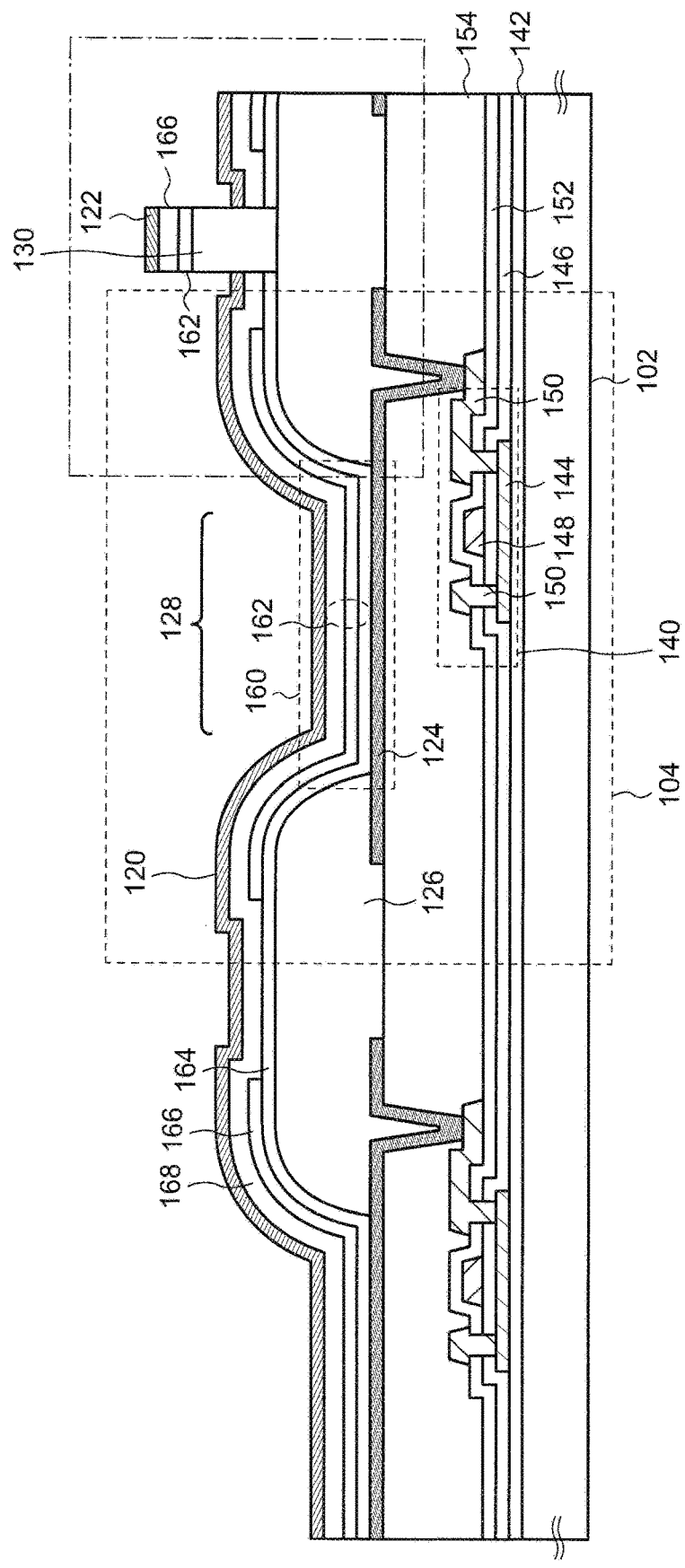
FIG. 4 is a schematic cross-sectional view of a display device of an embodiment of the present invention.

FIG. 3A shows an enlarged view of the display device 100 shown in FIG. 1, and FIG. 3B shows a perspective view of the structure shown in FIG. 3A. A part of the opposing electrode 120 and a part of the first conductive film 122 are omitted in FIG. 3A, and the opposing electrode 120 and the first electrode 122 are fully omitted in FIG. 3B. A cross-sectional view along a chain line A-A' of FIG. 3A is shown in FIG. 4.

For clarity, FIG. 1 and FIG. 2 are respectively illustrated so that there is a space in the short side and the long side between the adjacent opposing electrode 120 and the first conductive film 122. However, as shown in FIG. 3A and FIG. 4, the display device 100 may be fabricated so that a side surface of the opposing electrode 120 and a side surface of the first conductive film 122 exist in the same layer as each other. In this case, there is no space between the adjacent opposing electrode 120 and the first conductive film 122 in a plane view observed in a normal direction of the substrate 102. Alternatively, the opposing electrodes 120 and the first conductive film 122 may be provided so as to overlap with each other in a plane view. In other words, side surfaces of the adjacent opposing electrode 120 and first conductive film 122 exist in the same or substantially the same plane.

As shown in FIG. 3A and FIG. 3B, a partition wall 126 is provided under the opposing electrode 120 and the first conductive film 122. The pixel electrode 124 is disposed at a position corresponding to the pixel 104 and exposed from the partition wall 126 in an opening 128 formed in the partition wall 126. Furthermore, a structural member 130 is formed under the first conductive film 122. The structural member 130 is in contact with the partition wall 126 and provided between the partition wall 126 and the first conductive film 122. The structural member 130 is arranged so as to extend in a direction parallel to the short side direction or the long side direction of the display region 106. The structural member 130 is provided so as to remain in a region where the partition wall 126 is formed. In other words, the structural member 130 is formed at a position which does not overlap with the opening 128. Therefore, a width of each of the first conductive films 122 is smaller than a width of each of the plurality of opposing electrodes 120. As described below, the structural member 130 can include an insulator, and the insulator may be an organic insulator or an inorganic insulator.

As shown in FIG. 1 to FIG. 4, the adjacent opposing electrodes 120 are electrically disconnected due to the presence of the structural member 130 containing an insulator therebetween. The adjacent opposing electrodes 120 do not exist in the same plane as the first conductive film 122 therebetween, are positioned at a height different from that of the first conductive film 122, and are spaced from the first conductive film 122. Hence, the adjacent opposing electrode 120 and the first conductive film 122 are also electrically disconnected from each other.

As shown in the cross-sectional view of FIG. 4, the pixel 104 is provided with a transistor 140 and the light-emitting element 160 connected to the transistor 140. FIG. 4 shows an example in which one pixel 104 and one transistor 140 are disposed in one pixel 104. However, a plurality of transistors may be arranged, and another semiconductor element such as a capacitor element may be provided in one pixel 104.

The transistor 140 may possess, over an undercoat 142 formed over the substrate 102, a semiconductor film 144, a gate insulating film 146, a gate electrode 148, source/drain electrodes 150, and the like. An interlayer film 152 may be further formed over gate electrode 148. There is no limitation to a structure of the transistor 140, and a transistor of a top-gate type or a bottom-gate type may be used. A vertical relationship between the semiconductor film 144 and the source/drain electrodes 150 can also be freely selected, and a bottom-contact type or a top-contact type may be employed.

A leveling film 154 absorbing depressions, projections, and inclinations caused by the transistor 140 and other semiconductor elements and providing a flat surface is placed over the transistor 140. The pixel electrode 124 is electrically connected to one of the source/drain electrodes 150 through an opening formed in the leveling film 154.

The partition wall 126 covers an edge of the pixel electrode 124 and further fills the opening used for the connection of the pixel electrode 124 to one of the source/drain electrodes 150. Additionally, the structural member 130 in contact with the partition wall 126 is proved over the partition wall 126. As shown in FIG. 3A and FIG. 3B, it is not necessary to form the structural member 130 over every partition wall 126 sandwiched by the adjacent pixels 104 and may be provided every several or several tens of rows of the pixels 104. For example, a distance between the adjacent structural members 130 can be selected from a range from 1 mm to 5 mm or from 2 mm to 4 mm.

The EL layer 162 is disposed over the opening 128 and the partition wall 126, and the opposing electrode 120 is provided thereover. Note that, in the present specification and the claims, an EL layer means layers sandwiched between the pixel electrode 124 and the opposing electrode 120. The EL layer 162 is illustrated so as to include three layers 164, 166, and 168 in FIG. 4. However, as described below, the number of layers in the EL layer 162 is not limited.

All of or a part of the layers included in the EL layer 162 are also formed over the structural member 130, and the first conductive film 122 is disposed thereover. As described below, the opposing electrodes 120 and the first conductive films 122 are prepared at the same time. Therefore, the opposing electrodes 120 and the first conductive films 122 exist in the same layer and are able to possess the same structure and components. Simultaneous formation of the opposing electrodes 120 and the first conductive films 122 results in physical disconnection therebetween due to the steps originating from the structural members 130. Therefore, the plurality of opposing electrodes 120 is electrically independent from one another as described above.

Figure 5A:
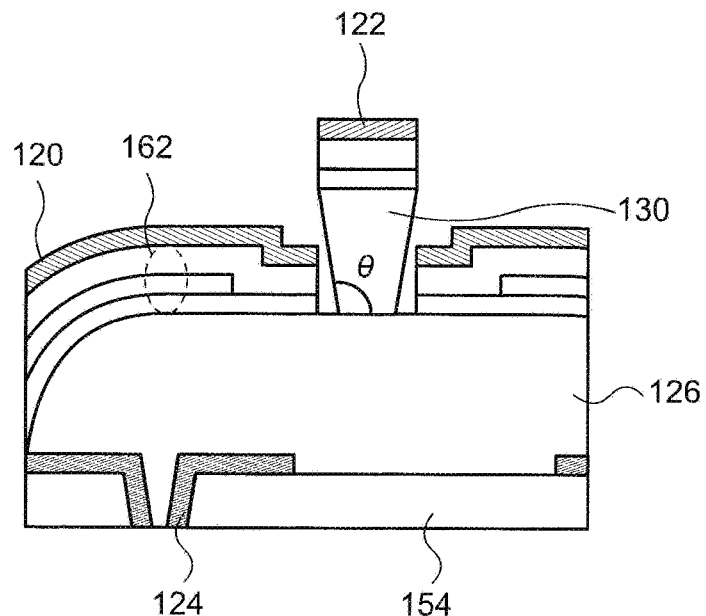
FIG. 5A and FIG. 5B are schematic cross-sectional views of a display device of an embodiment of the present invention.
Figure 5B:
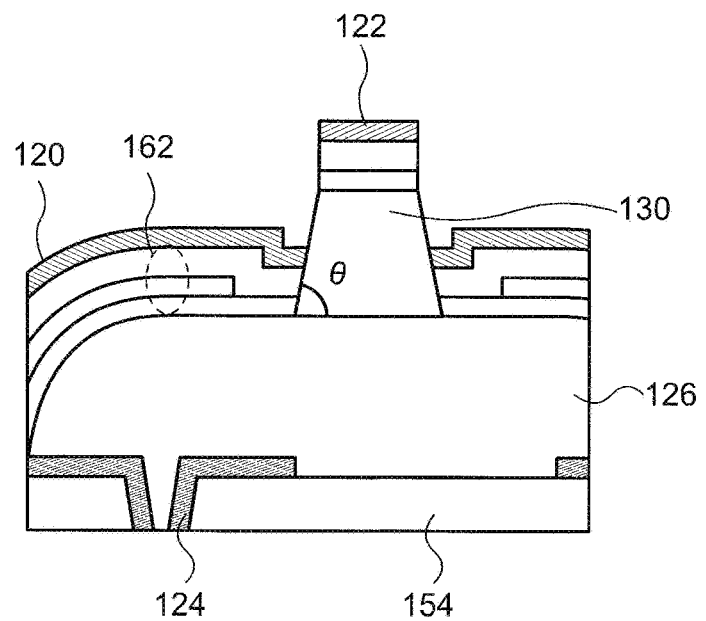

A cross-sectional shape of the structural member 130 may be rectangular as shown in FIG. 4 or square. Alternatively, the structural member 130 may have a trapezoidal cross section as shown in FIG. 5A and FIG. 5B. In this case, an angle (taper angle) θ between a bottom surface and a side surface of the structural member 130 may be larger than 90° as shown in FIG. 5A or smaller than 90° as shown in FIG. 5B. When the θ is larger than 90°, the opposing electrode 120 and the first conductive film 122 may overlap with each other. On the other hand, when the θ is equal to or smaller than 90°, a part of the opposing electrode 120 may be in contact with the side surface of the structural member 130 (FIG. 5B).

Figure 6:
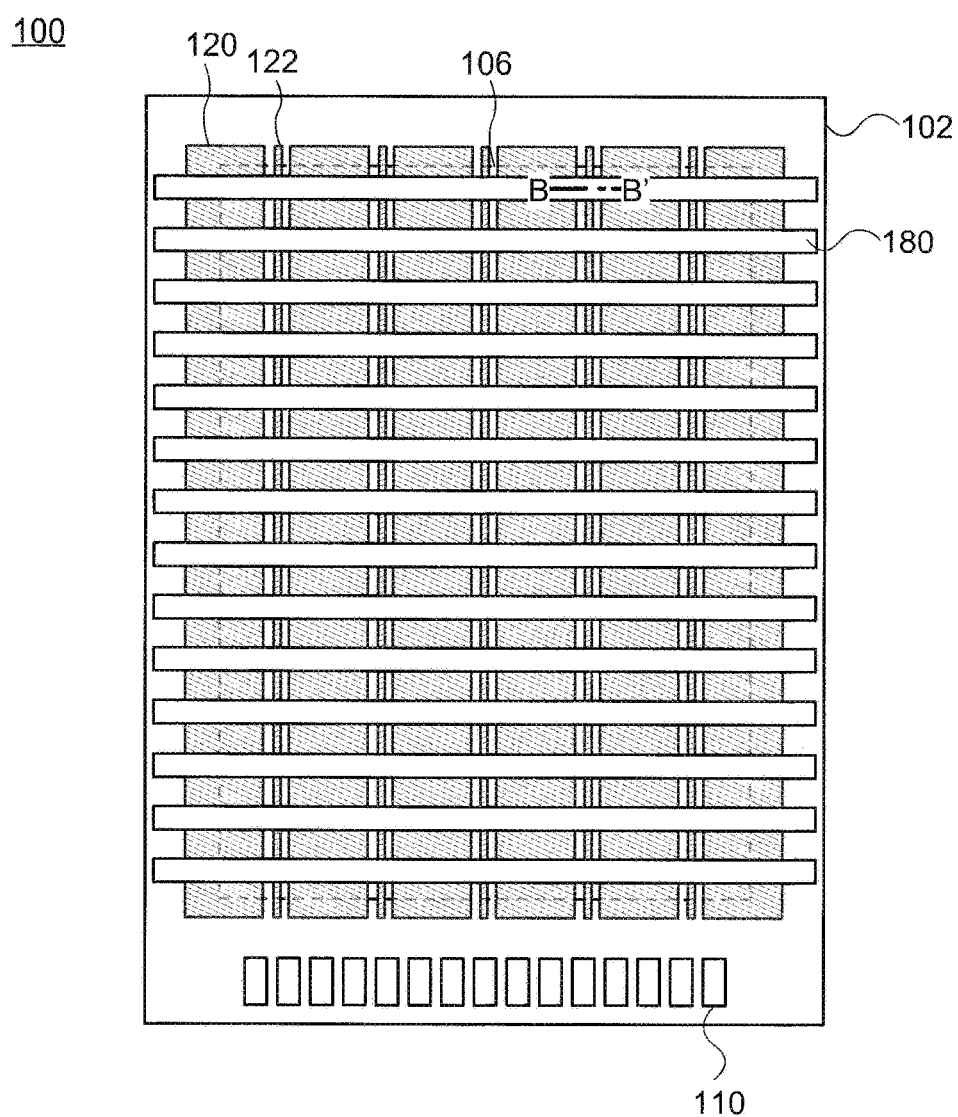
FIG. 6 is a schematic top view of a display device of an embodiment of the present invention.
Figure 7:
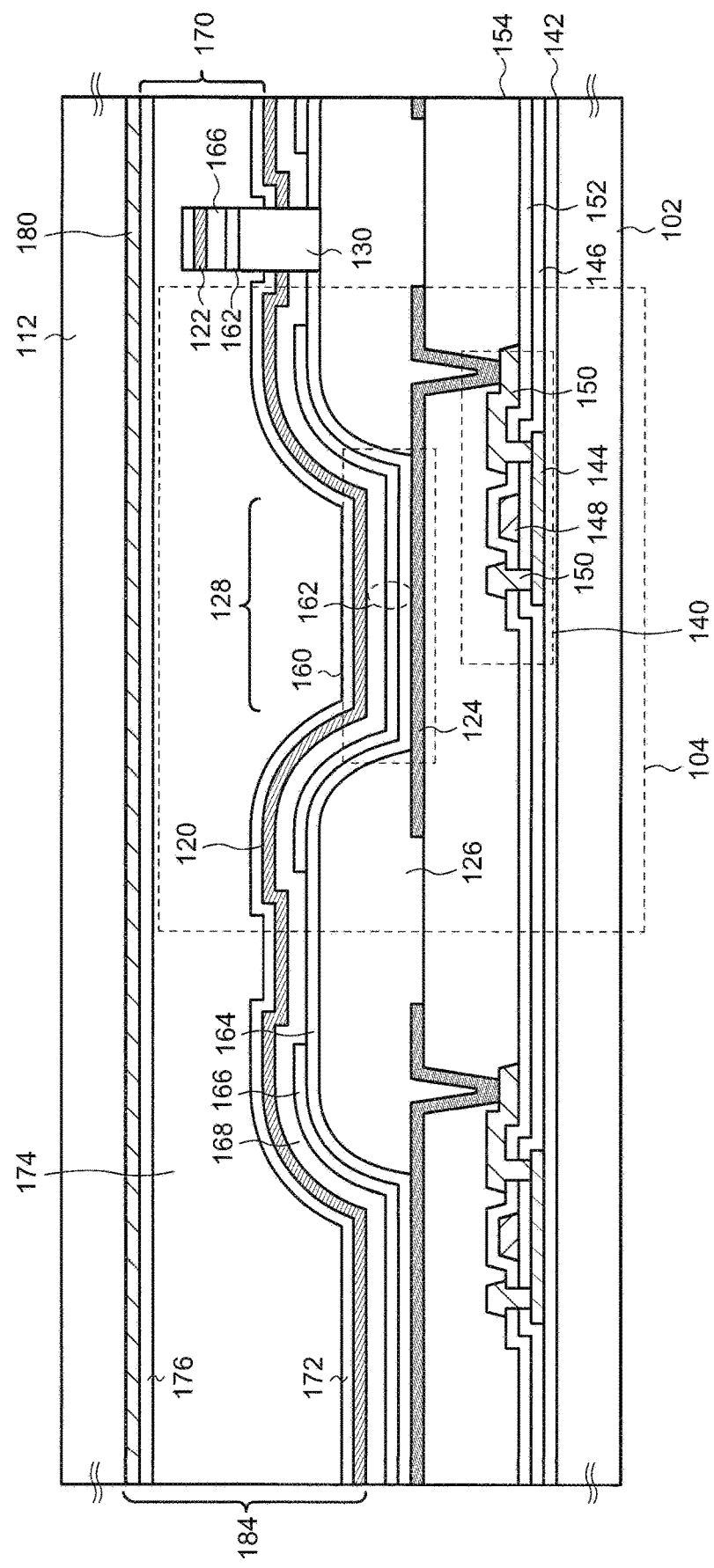
FIG. 7 is a schematic cross-sectional view of a display device of an embodiment of the present invention.

The display device 100 may further possess, as an optional structure, a second electrode over the opposing electrodes 120 and the first conductive films 122 with an insulating film interposed therebetween. A specific structure is shown in FIG. 6 and FIG. 7. FIG. 7 is a schematic cross-sectional view along a chain line B-B' shown in FIG. 6. In FIG. 6, the opposing substrate 112 is not illustrated. As shown in FIG. 6 and FIG. 7, the display device 100 may have an insulating film 170 over the opposing electrodes 120 and the first conductive films 122, and a plurality of second electrodes 180 located over the insulating film 170 and arranged in a stripe shape extending in a direction perpendicular to a direction in which the opposing electrodes 120 and the first conductive films 122 extend. Additionally, the opposing substrate 112 may be provided over the second electrodes 180 as an optional structure (FIG. 7).

Note that FIG. 7 is illustrated so that the insulating film 170 possesses a first layer 172, a second layer 174, and a third layer 176. In this case, the first layer 172 is formed over the opposing electrodes 120 and the first conductive films 122. However, a structure of the insulating film 170 is not limited, and the insulating film 170 structured with a single layer may be employed.

The insulating film 170 has a function to protect the light-emitting element 160 and simultaneously generates a capacitance in associate with the opposing electrodes 120 and the second electrodes 180. That is, a capacitance is formed by a stacked structure 184 including the plurality of opposing electrodes 120 fabricated in a stripe shape, the insulating film 170, and the second electrodes 180 fabricated in a stripe shape in a direction intersecting with the opposing electrodes 120, and this stacked structure 184 functions as a touch panel. Hence, when a finger or a palm makes contact with the second electrodes 180 directly or through the opposing substrate 112 (hereinafter, this operation is called a touch), the capacitance changes, and it is possible to sense whether a touch is made or not and determine a position of the touch by sensing the change of the capacitance. Namely, the opposing electrode 120 functions as one of the electrodes of the light-emitting element 160 and also serves as one electrode of a touch panel. In other words, the opposing electrode 120 is shared by the light-emitting element 160 and a touch panel.

Note that a plurality of first conductive films 122 may be used as one electrode of a touch panel instead of the opposing electrodes 120.

As describe above, in the display device 100 shown in the present embodiment, the adjacent two opposing electrodes 120 and the first conductive film 122 provided therebetween are spaced from and electrically disconnected from one another. That is, the display device 100 is able to possess the plurality of opposing electrodes 120 electrically independent from one another as upper electrodes of the light-emitting elements 160. Additionally, the display device 100 can include the stripe-shape electrodes (second electrodes 180) located over and perpendicularly intersecting with the plurality of opposing electrodes 120. Namely, the display device 100 is capable of functioning as a so-called in-cell type touch panel. Hence, it is not necessary to separately prepare and bind a display device and a touch panel, and a display device and a touch panel can be fabricated over one substrate (here, the substrate 102). Therefore, the present embodiment allows production of a display device installed with a touch panel by a simple process at low cost.

<Second Embodiment>

In the present embodiment, a manufacturing method of the display device 100 shown in the First Embodiment is explained by using FIG. 8A to FIG. 14. FIG. 8A to FIG. 14 correspond to the cross-sectional view shown in FIG. 7. Explanation of the structures the same as those of the First Embodiment may be omitted.

1. Transistor.

First, the undercoat 142 is formed over the substrate 102 (FIG. 8A). The substrate 102 has a function to support the semiconductor elements and the like included in the display device 100, such as the transistor 140, the light-emitting element 160, and the second electrodes 180. Therefore, a material having thermal resistance to process temperature of a variety of elements formed thereover and chemical stability to chemicals used in the process may be used for the substrate 102. Specifically, the substrate 102 may include glass, quartz, plastics, a metal, ceramics, and the like. When flexibility is provided to the display device 100, a material selected from a polymer material exemplified by a polyimide, a polyamide, a polyester, and a polycarbonate can be used for the substrate 102.

The undercoat 142 is a film having a function to prevent impurities such as alkaline metals from diffusing to the transistor 140 and the like from the substrate 102 and may contain an inorganic insulator such as silicon nitride, silicon oxide, silicon nitride oxide, and silicon oxynitride. The undercoat 142 may be prepared by applying a chemical vapor deposition method (CVD method), a sputtering method, or the like so as to have a single-layer or stacked-layer structure. Note that, when an impurity concentration in the substrate 102 is low, the undercoat 142 may not be provided or be formed so as to partly cover the substrate 102.

Next, the semiconductor film 144 is formed over the undercoat 142. The semiconductor film 144 may contain Group 14 elements such as silicon. Alternatively, the semiconductor film 144 may include an oxide semiconductor. As an oxide semiconductor, Group 13 elements such as indium and gallium are represented. For example, a mixed oxide of indium and gallium (IGO) may be used. When an oxide semiconductor is used, the semiconductor film 144 may further contain a Group 12 element, and a mixed oxide of indium, gallium, and zinc is exemplified. Crystallinity of the semiconductor film 144 is not limited, and the semiconductor film 144 may be single crystalline, polycrystalline, microcrystalline, or amorphous.

When the semiconductor film 144 includes silicon, the semiconductor film 144 may be prepared with a CVD method by using a silane gas and the like as a raw material. A heat treatment or application of light such as a laser may be performed on amorphous silicon obtained to conduct crystallization. When the semiconductor film 144 includes an oxide semiconductor, the semiconductor film 144 can be formed by utilizing a sputtering method and the like.

Next, the gate insulating film 146 is prepared so as to cover the semiconductor film 144. The gate insulating film 146 may have a single-layer structure or a stacked-layer structure and can be formed with the same method as that of the undercoat 142. Alternatively, an inorganic compound having a high permittivity, such as hafnium oxide and hafnium silicate, may be used.

Next, the gate electrode 148 is formed over the gate insulating film 146 with a sputtering method or a CVD method (FIG. 8B). The gate electrode 148 may be formed with a metal such as titanium, aluminum, copper, molybdenum, tungsten, tantalum or an alloy thereof so as to have a single-layer or stacked-layer structure. For example, a structure in which a highly conductive metal such as aluminum and copper is sandwiched by a metal with a relatively high melting point, such as titanium, tungsten, and molybdenum, can be employed.

Next, the interlayer film 152 is formed over the gate electrode 148 (FIG. 8B). The interlayer film 152 may have a single-layer or stacked layer structure and can be prepared with the same method as that of the undercoat 142.

Next, etching is performed on the interlayer film 152 and the gate insulating film 146 to form openings reaching the semiconductor film 144 (FIG. 8C). The openings can be prepared, for example, by conducting plasma etching in a gas including a fluorine-containing hydrocarbon. Next, a metal film is formed to cover the openings and processed with etching, forming the source/drain electrodes 150 (FIG. 8B). The metal film may have a similar structure to that of the gate electrode 148 and can be formed with a method similar to that of the gate electrode 148. Through the aforementioned process, the transistor 140 is fabricated.

2. Structural Member

Next, the leveling film 154 is formed so as to cover the source/drain electrodes 150 (FIG. 9A). As described above, the leveling film has a function to absorb depressions, projections, and inclinations caused by the semiconductor elements such as the transistor 140 and provide a flat surface. The leveling film 154 can be prepared with an organic insulator. As an organic insulator, an epoxy resin, an acrylic resin, a polyimide, a polyamide, a polyester, a polycarbonate, a polysiloxane, and the like are represented, and the leveling film 154 can be formed with a wet-type film-forming method such as a spin-coating method, a dip-coating method, an ink-jet method, and a printing method. The leveling film 154 may have a stacked structure including a layer containing the aforementioned organic insulator and a layer containing an inorganic insulator. In this case, a silicon-containing inorganic insulator such as silicon oxide, silicon nitride, silicon nitride oxide, and silicon oxynitride is exemplified as an inorganic insulator, and a film including these materials can be formed with a sputtering method or a CVD method.

Next, etching is performed on the leveling film 154 to form the opening reaching one of the source/drain electrodes 150 (FIG. 9A). After that, the pixel electrode 124 is prepared over the leveling film 154 with a sputtering method and the like so as to cover the opening (FIG. 9B). Note that the present embodiment shows a structure in which the pixel electrode 124 directly contacts with the source/drain electrode 150. However, another layer having conductivity may be formed between the pixel electrode 124 and the source/drain electrode 150.

The pixel electrode 124 may include a conductive oxide with a light-transmitting property, a metal, or the like. When light obtained from the light-emitting element 160 is extracted in a direction opposite to the substrate 102, a metal such as aluminum and silver or an alloy thereof can be used for the pixel electrode 124. In this case, a stacked structure of the aforementioned metal or alloy with the conductive oxide having a light-transmitting property, i.e., a stacked structure (conductive oxide/silver/conductive oxide) in which a metal is sandwiched by a conductive oxide may be employed. As a conductive oxide, indium-tin oxide (ITO) and indium-zinc oxide (IZO) can be used.

Next, the partition wall 126 is formed so as to cover the edge of the pixel electrode 124 (FIG. 9B). The formation of the partition wall 126 allows the steps caused by the pixel electrode 124 and the like to be absorbed and the pixel electrodes 124 of the adjacent pixels 104 to be electrically insulated from each other. The partition wall 126 is also an insulating film and may be prepared with a wet-type film-forming method by using a material usable in the leveling film, such as an epoxy resin and an acrylic resin. Specifically, a resist responsive to light such as ultraviolet light is applied, and a region over which the partition wall 126 is formed is irradiated with light (exposure), while shielding the region from the light with a photomask. The exposed portion is removed by development, and the remaining resist is heated to be cured, providing the partition wall 126. In the development and heating, a curved surface shown in FIG. 9B is provided at an upper surface of the partition wall 126.

Next, the structural member 130 is formed over the partition wall 126. Specifically, the structural member 130 is prepared by using an inorganic insulator or an organic insulator.

As an inorganic insulator, a silicon-containing inorganic compound such as silicon oxide, silicon nitride, silicon oxynitride, silicon nitride oxide is represented. The structural member 130 including these materials can be formed with a CVD method or a sputtering method. When a CVD method is employed, a silane gas, a trialkoxysilane, a tetraalkoxysilane, or the like may be used as a raw material gas, oxygen, ozone, or the like may be used as an oxygen source, and ammonia, nitrogen oxide, or the like may be used as a nitrogen source. Note that an inorganic compound other than those exemplified can be used. For example, an inorganic compound which does not transmit visible light or a colorized inorganic compound may be utilized.

With the aforementioned method, a film 190 including an inorganic insulator is formed over the pixel electrode 124 and the partition wall 126. In FIG. 10A, a structure is shown in which two films 186 and 188 containing an inorganic compound are stacked. However, only a single film 186 may be used, or the film 190 may be prepared with three or more films.

Figure 11A:
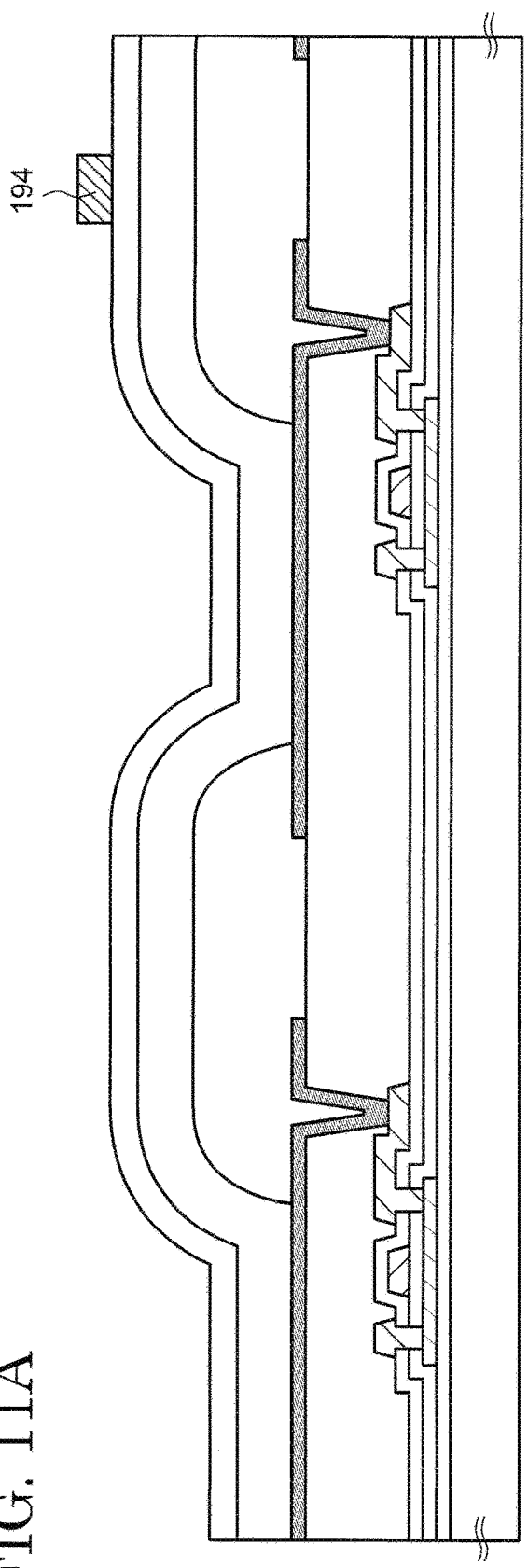
FIG. 11A and FIG. 11B are schematic cross-sectional views showing a manufacturing method of a display device of an embodiment of the present invention.

Next, a resist 192 is formed over the film 190 (FIG. 10B), and exposure with the use of a photomask, development with an etchant, and heating of a remaining portion are carried out sequentially, forming the resist mask 194 (FIG. 11A).

Figure 11B:
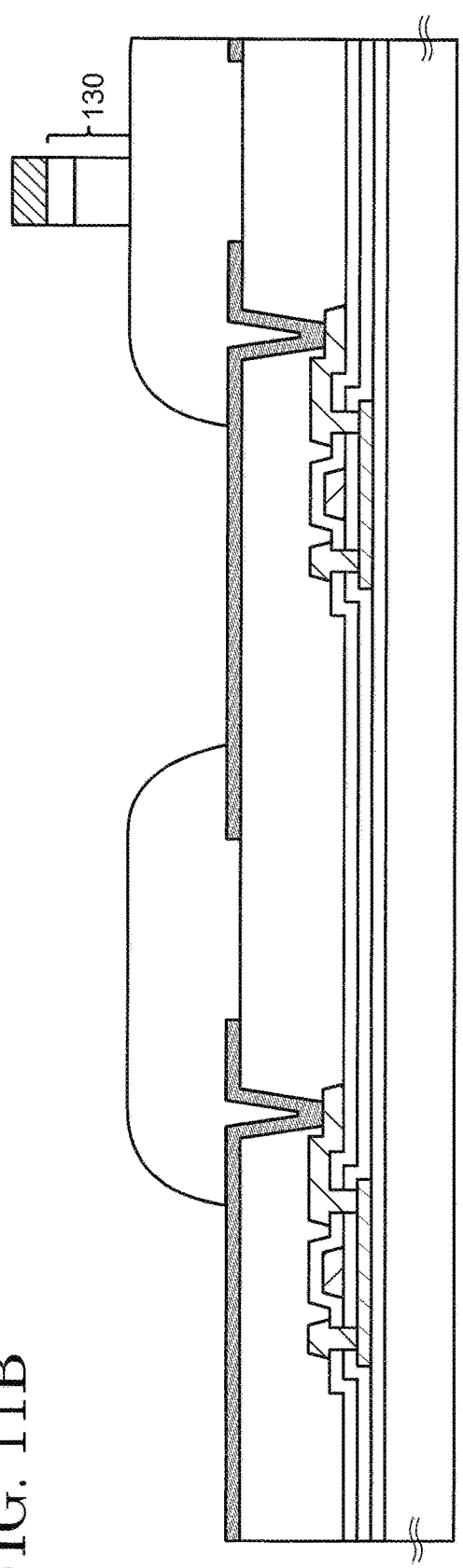

Next, etching is performed to remove the film 190, leaving only a portion covered by the resist mask 194 (FIG. 11B). The etching may be dry etching or wet etching. Dry etching may be conducted by treating the film 190 with a fluorine-containing hydrocarbon such as $CF_4$ and $CHF_3$ in the presence of plasma. Wet etching may be performed by treating the film 190 with an acidic etchant such as phosphoric acid, hydrofluoric acid, or hydrofluoric acid containing ammonium fluoride or an alkaline etchant such as a solution of tetramethylammonium hydroxide (TMAH).

After that, the resist mask 194 is removed (FIG. 12A). The resist mask 194 can be removed by treating with an oxygen gas in the presence of plasma (ashing), for example.

Through the above process, the structural member 130 containing an inorganic insulator can be prepared.

When the structural member 130 including an organic insulator is prepared, a film 190 including an organic insulator is formed over the pixel electrode 124 and the partition wall 126 (FIG. 10A). Similar to the preparation of the structural member 130 including an inorganic insulator, the film 190 may have a single-layer structure or a stacked-layer structure shown in FIG. 10A. As an organic insulator, a photo-sensitive material may be used. For example, a polymer or oligomers which decrease in solubility upon light irradiation can be used. In this case, as a polymer or oligomers, an epoxy resin, an acrylic resin, a polyester resin, a polyimide resin, and the like may be used. Typically, a negative resist having poly(vinyl cinnamate) and the like as a basic skeleton can be used. As a material which increases in solubility upon light irradiation, a positive resist is exemplified, and a polymer material having a substituted polystyrene as a basic skeleton is represented.

Exposure is performed on the film 190 with a use of a photomask, and the development is carried out so as to leave the structural member 130 (FIG. 12A). Hence, unlike the formation of the structural body 130 including an inorganic insulator, it is not necessary to prepare the resist mask 194.

Next, the structural member 130 including an organic insulator is cured. Specifically, after forming the structural member 130, a drying treatment is conducted to remove moisture from the structural member 130 and the partition wall 126. The drying treatment is carried out at a temperature from 50° C. to 150° C. or preferably at a temperature which does not exceed a glass-transition temperature of the organic insulator. This drying treatment may be performed at a normal pressure or a reduced pressure (e.g., approximately 10 Pa).

Next, light irradiation is performed on the structural member 130 after drying. For example, light is applied under an atmosphere of an inert gas such as nitrogen or argon. It is preferred that the atmosphere at this stage does not contain moisture, and the atmosphere is adjusted so that a dew point is approximately −60° C. or a water concentration is approximately 1 ppm. A temperature during light irradiation can be selected from a range from room temperature to a glass-transition temperature of the organic insulator. Ultraviolet light is represented as the applied light, and the light may include a wavelength ranging from 200 nm to 400 nm. With the light irradiation, cross-linking of the organic insulator proceeds, leaving the shape of the structural member 130 unchanged. As a result, the structural member 130 is cured, significant deformation caused in a heat treatment conducted later can be prevented, and the structure thereof can be maintained.

Through the aforementioned process, the structural member 130 containing an inorganic insulator or an organic insulator can be formed. Note that an organic insulator is advantageous in the formation of the structural member 130 with a large thickness because an organic insulator is able to provide a thick film.

3. Light-Emitting Element

Next, the light-emitting element 160 is fabricated. Specifically, the EL layer 162 is formed over the pixel electrode 124, the partition wall 126, and the structural member 130 (FIG. 12B). In FIG. 12B, the EL layer 162 is shown to possess a three-layer structure including the first layer 164, the second layer 166, and the third layer 168. However, there is no limitation to the structure of the EL layer 162. The EL layer 162 may be formed with a single layer or 4 or more layers. For example, the EL layer 162 can be prepared by appropriately combining a carrier-injection layer, a carrier-transporting layer, an emission layer, a carrier-blocking layer, an exciton-blocking layer, and the like. The EL layer 162 can be prepared with the aforementioned wet-type film-forming method or an evaporation method.

In FIG. 12B, an example is shown where the first layer 164 and the third layer 168 are shared by the adjacent pixels 104, while the second layer 166 is individually formed between the adjacent pixels 104. In order to provide this structure, first, a metal mask covering a region other than the display region is first set under the substrate 102, evaporating a material forming the first layer 164 from an evaporation source arranged under the substrate 102, and solidifying vapor of the material at a surface of the pixel electrode 124 to form the first layer 164. Next, a metal mask selectively covering a region other than the pixel 104 in which the second layer 166 is formed is used, a material forming the second layer 166 is evaporated, and then vapor of the material is solidified, forming the second layer 166. Finally, the third layer 168 is prepared by a similar method to that of the first layer 164. When this method is used, the first layer 164 and the third layer 168 of the EL layer 162 exist over the structural member 130.

The EL layer 162 may be different in structure between the adjacent pixels 104. For example, the EL layer 162 may be fabricated so that the emission layer is different but other layers have the same structure between the adjacent pixels 104. On the contrary, the same EL layer 162 may be used in all of the pixels 104. In this case, a white-emissive EL layer 162 is formed so as to be shared by the adjacent pixels 104, and a wavelength of light extracted from each pixel 104 is selected by using a color filter, for example.

Next, a metal film is formed over the EL layer 162 (FIG. 12B). As a result, the plurality of opposing electrodes 120 and the plurality of conductive films 122 are simultaneously formed. Therefore, the plurality of opposing electrodes 120 and the plurality of conductive films 122 exist in the same layer. In this case, the metal film is divided into a portion overlapping with the structural member 130 and the other portion because of the step caused by the structural member 130. The metal film stacked over the structural member 130 provides the first conductive layers 122, while the metal film stacked over the other region results in the opposing electrodes 120. The adjacent opposing electrodes 120 are electrically disconnected from each other, and the conductive film 122 positioned therebetween does not exist in the same plane as the opposing electrodes 120, is located at a different height from that of the opposing electrodes 120, and is spaced from the opposing electrodes 120. Hence, the adjacent opposing electrodes 120 and the first conductive film 122 therebetween are electrically disconnected from one another.

A metal such as magnesium, silver, and aluminum or an alloy thereof can be used as the metal film. A conductive oxide such as ITO and IZO may be stacked over the metal film of these metals. The metal film can be prepared with an evaporation method, a sputtering method, or the like.

Through the aforementioned process, the light-emitting element 160 is fabricated.

4. Touch Panel

Figure 13A:
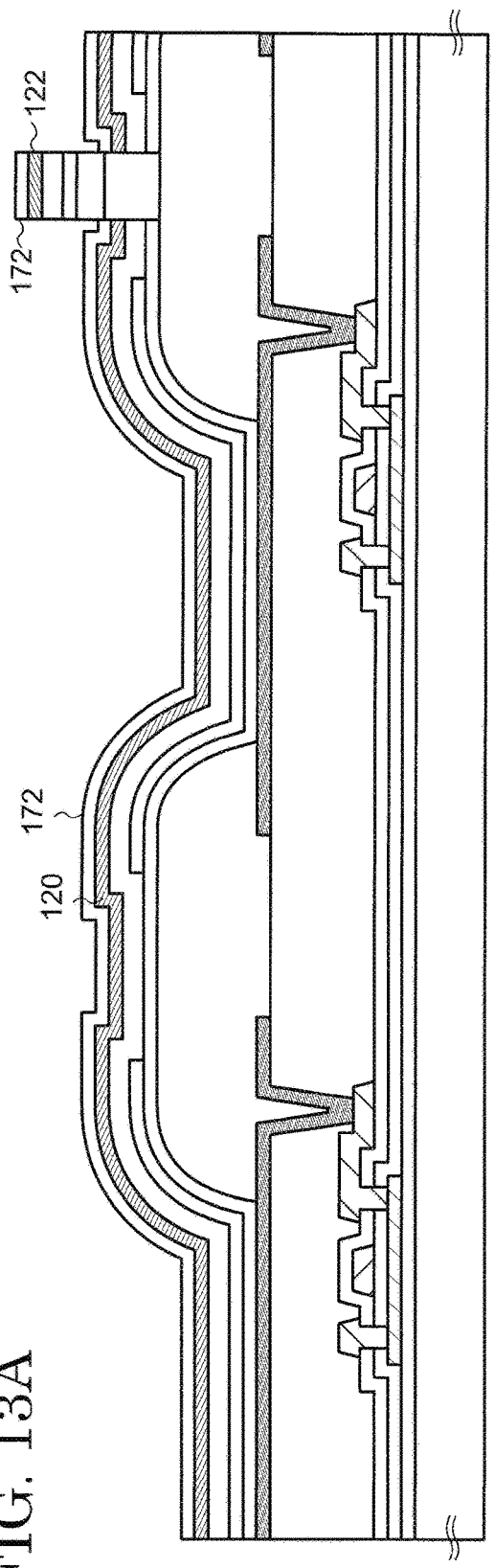
FIG. 13A and FIG. 13B are schematic cross-sectional views showing a manufacturing method of a display device of an embodiment of the present invention.
Figure 13B:
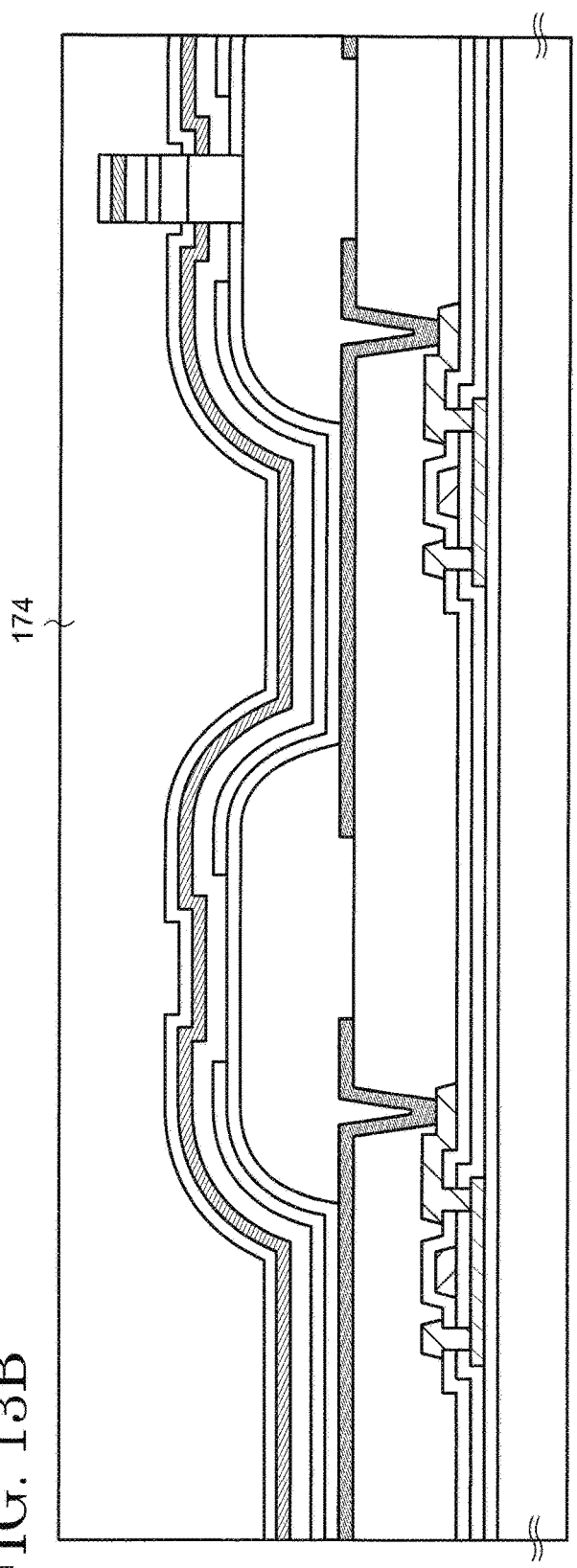
Figure 14:
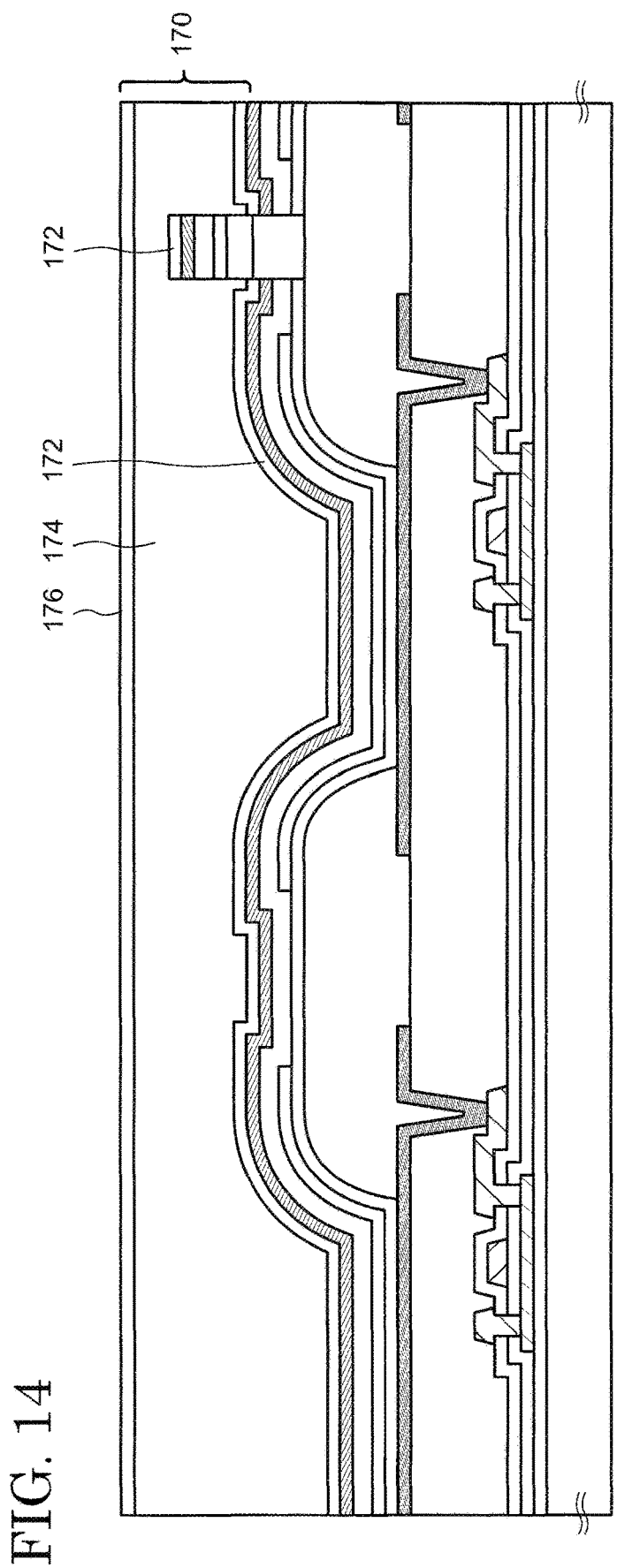
FIG. 14 is a schematic cross-sectional view showing a manufacturing method of a display device of an embodiment of the present invention.

The insulating film 170 disposed over the light-emitting element 160 may have a three-layer structure as shown in FIG. 14. This structure is formed as shown below. First, the first layer 172 is formed over the opposing electrode 120 and the first conductive film 122 (FIG. 13A). The first layer 172 may include an inorganic compound such as silicon nitride, silicon oxide, silicon nitride oxide, and silicon oxynitride and may be prepared with the same method as that of the undercoat 174. Next, the second layer 174 is prepared (FIG. 13B). The second layer 174 may contain an organic resin including an acrylic resin, a polysiloxane, a polyimide, a polyester, and the like. Furthermore, as shown in FIG. 13B, the second layer 174 may be formed at a thickness so that depressions and projections caused by the partition wall 126 and the structural member 130 are absorbed and a flat surface is provided. The second layer 174 may be formed by the aforementioned wet-type film-forming method. Alternatively, the second layer 174 may be prepared by atomizing or vaporizing oligomers serving as a raw material of the aforementioned polymer material at a reduced pressure, spraying the first layer 172 with the oligomers, and then polymerizing the oligomers. After that, the third layer 176 is formed (FIG. 14). The third layer 176 may have the same structure as the first layer 172 and can be formed with the same method as that of the first layer 172.

A high gas-barrier property of the insulating film 170 with such a structure prevents impurities such as moisture and oxygen from entering the light-emitting element 160, providing high reliability to the display device 100.

After that, the second electrodes 180 are formed as shown in FIG. 7. The second electrodes 180 may be formed with a sputtering method and the like by using a conductive oxide with a light-transmitting property, such as ITO and IZO, for example. The second electrodes 180 are formed so as to extend in the direction perpendicular to the direction in which the plurality of opposing electrodes 120 and the plurality of first conductive films 122 extend as shown in FIG. 6.

Through the aforementioned process, it is possible to manufacture the display device 100 having the plurality of opposing electrodes 120 electrically independent from one another as the upper electrodes of the light-emitting elements 160. One of the conventional methods for manufacturing a plurality of upper electrodes electrically independent from one another includes forming upper electrodes with an evaporation method by using an evaporation metal mask having openings over the regions other than the region where the upper electrode is divided. However, in this method, the metal mask must have extremely large openings, and it is necessary to prepare extremely fine shielding frames intersecting the openings. Hence, not only is the preparation of the metal mask difficult but also its strength is considerably decreased. Tension must be applied to the metal mask in order to place the metal mask over a substrate at high accuracy, and the metal mask may be readily deformed or damaged by the tension when the metal mask has a large opening. Therefore, it is extremely difficult to divide an upper electrode in to a plurality of electrodes with a metal mask.

On the other hand, it is possible to process an upper electrode into an arbitrary shape by using a photolithography technology. However, an EL layer is readily damaged physically or chemically in development or etching of the photolithography, by which a function as a light-emitting element is lost. Hence, it is substantially difficult to apply photolithography to divide an upper electrode.

In contrast, in the manufacturing method described in the present embodiment, the upper electrode is readily divided to provide the plurality of electrically independent opposing electrodes 120 by preparing the structural members 130 over the partition wall 128. Additionally, as described in the First Embodiment, the plurality of opposing electrodes 120 not only function as the upper electrodes of the light-emitting elements 160 but also can be utilized as one electrode of a touch panel. Hence, an in-cell type touch panel can be readily produced at low cost with the manufacturing method described in the present embodiment.

<Third Embodiment>

In the present embodiment, a display device 200 different in structure from those of the First and Second Embodiments is explained by using FIG. 15A to FIG. 16B. Explanation of the structures the same as those of the First and Second Embodiments may be omitted.

The display device 200 is different from the display device 100 in having a second conductive film 132 between the structural member 130 and the first conductive film 122. Specifically, as shown in FIG. 15A, the display device 200 possesses the structural member 130 over the partition wall 126, and the second conductive film 132 over and in contact with the structural member 130.

The structural member 130 may have the same structure as that of the structural member 130 described in the First and Second Embodiments and may include an inorganic insulator, for example. On the other hand, a metal such as aluminum, titanium, molybdenum, tungsten, and tantalum can be used for the second conductive film 132. Alternatively, the second conductive film 132 may contain a metal included in the gate electrode 148 or the source/drain electrodes 150.

When the second conductive film 132 is provided, an area of a top surface of the structural member 130 may be smaller than an area of a bottom surface of the second conductive film 132 as shown in FIG. 15B. In this case, the structural member 130 may have a trapezoidal cross section. Alternatively, the structural member 130 may have a curved shape so that a side surface thereof is depressed inward (FIG. 15C). In FIG. 15B and FIG. 15C, the EL layer 160 is illustrated so as not to be in contact with the side surface of the structural body 130. However, although depending on the shape of the structural member 130, the EL layer 162 may enter under the conductive film 132 when the EL layer 162 is formed. As a result, the side surface of the structural member 130 may be in contact with the EL layer 162 as shown in FIG. 15D and FIG. 15E.

Figure 16A:
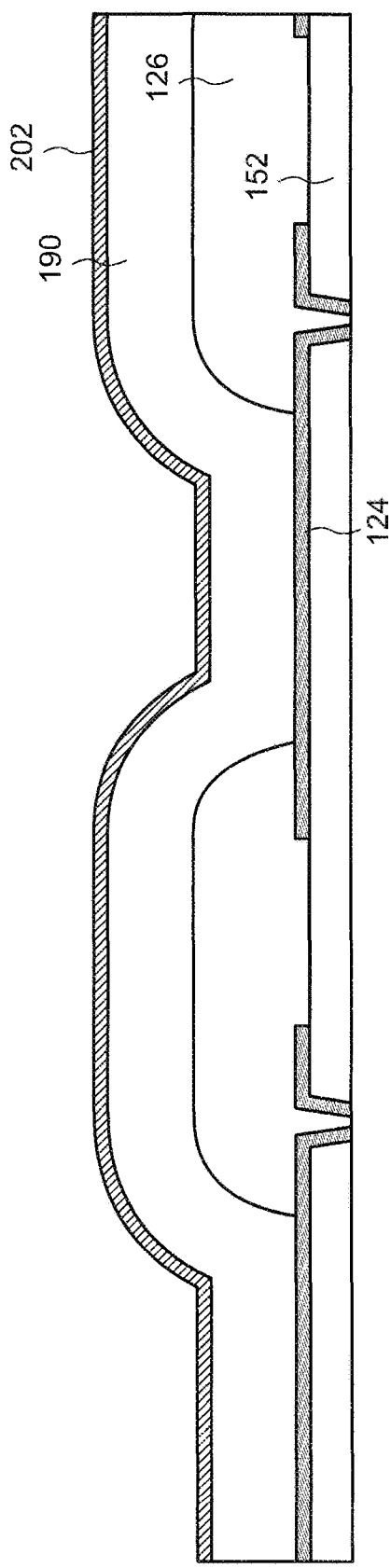
FIG. 16A and FIG. 16B are schematic cross-sectional views showing a manufacturing method of a display device of an embodiment of the present invention.
Figure 16B:
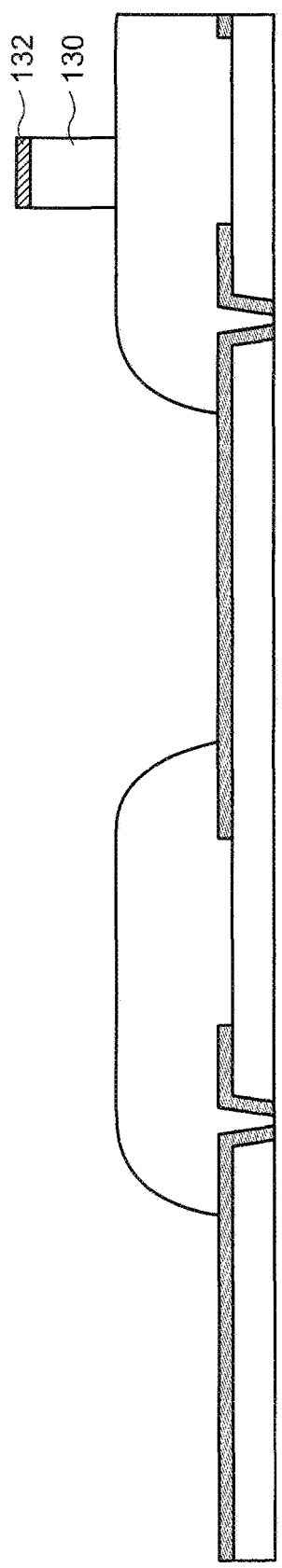

The structural member 130 and the second conductive film 132 thereover of the present embodiment can be prepared by a method shown in FIG. 16A and FIG. 16B. That is, as described in the Second Embodiment, the film 190 including an inorganic insulator or an organic insulator is formed over the pixel electrode 124 and the partition wall 126. After that, a conductive film 202 is further disposed over the film 190 (FIG. 16A). Although detailed explanation is omitted, similar to the method described in the Second Embodiment, the structural member 130 and the second conductive film 132 shown in FIG. 16B can be constructed by forming a resist over the conductive film 202, exposing and developing the resist to form a resist mask, and partly removing the conductive film 202 and the film 190. After that, the light-emitting element 160 is fabricated by a similar method to that described in the Second Embodiment, by which the display device 200 is manufactured.

When a conductivity of a material used in the opposing electrode 120 serving as one electrode of the light-emitting element 160 is not high or when a thickness of the opposing electrode 120 cannot be increased in order to secure a light-emitting property, a conductivity of the opposing electrode 120 may not be sufficient to be used as one electrode of a touch panel. On the other hand, the use of the structure shown in the present embodiment allows the second conductive film 132 having a high conductivity to be arranged in a stripe shape and effectively function as one electrode of a touch panel.

<Fourth Embodiment>

In the present embodiment, a display device 300 different in structure from those described in the First to Third Embodiments is explained by using FIG. 17 to FIG. 20. Explanation of the structures the same as those of the First to Third Embodiments may be omitted.

Figure 17:
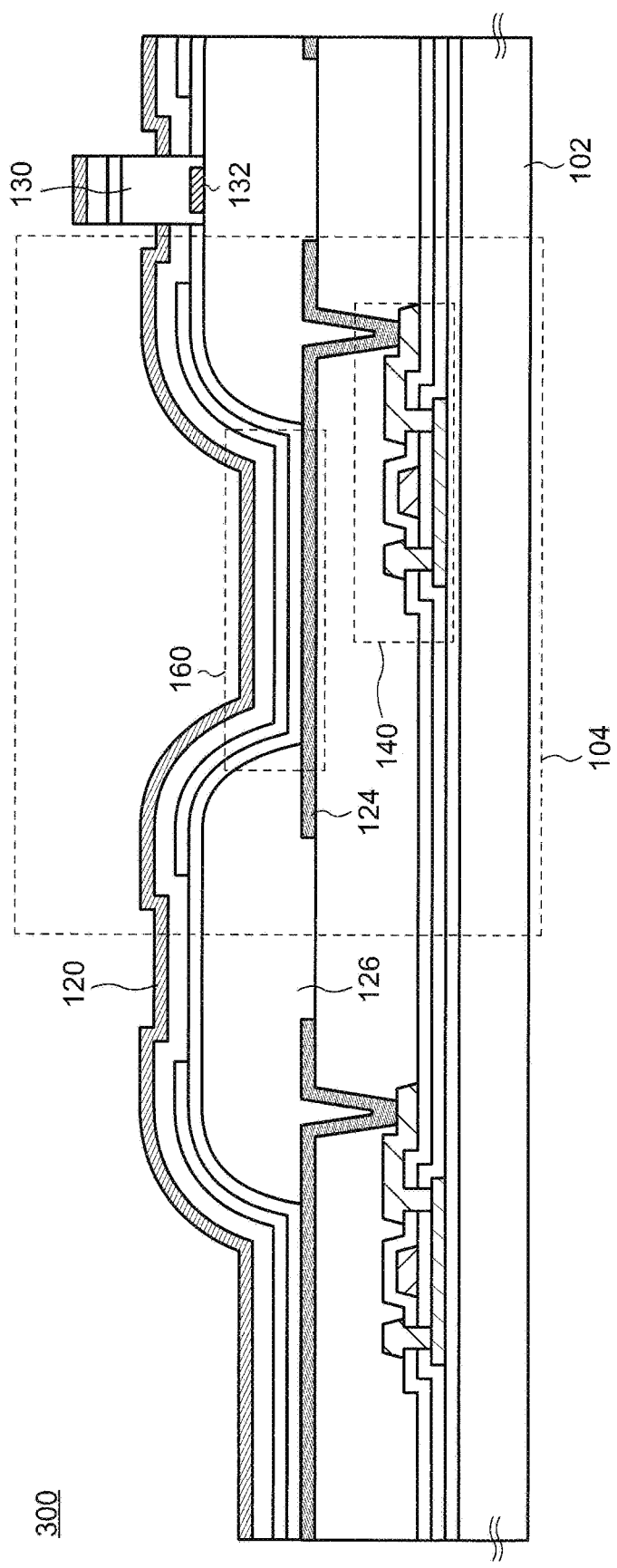
FIG. 17 is a schematic cross-sectional view of a display device of an embodiment of the present invention.

The display device 300 is different from the display device 200 in that the second conductive film 132 is disposed inside the structural member 130. Specifically, as shown in FIG. 17, the display device 300 possesses the second conductive film 132 over and in contact with the partition wall 126, and the second conductive film 132 is covered by the structural member 130. The structural member 130 may include an inorganic insulator or an organic insulator.

Figure 18A:
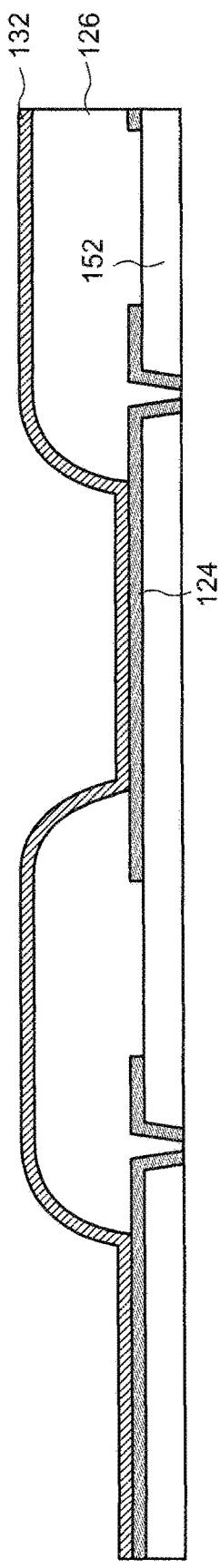
FIG. 18A to FIG. 18C are schematic cross-sectional views showing a manufacturing method of a display device of an embodiment of the present invention.

The second conductive film 132 and the structural member 130 having such a structure can be fabricated by a method shown in FIG. 18A to FIG. 19B. Specifically, the second conductive film 132 is formed so as to cover the pixel electrode 124 and the partition wall 126 (FIG. 18A). The second conductive film 132 can be prepared with a metal included in the gate electrode 148 or the source/drain electrodes 150 by applying a sputtering method or a CVD method. After that, as described in the Second Embodiment, a resist is applied over the second conductive film 132, a resist mask is formed by exposing the resist through a photomask and developing the resist, the second conductive film 132 is etched, and the resist mask is removed, by which the second conductive film 132 is formed at a position where the structural member 130 is provided (FIG. 18B).

Figure 18B:
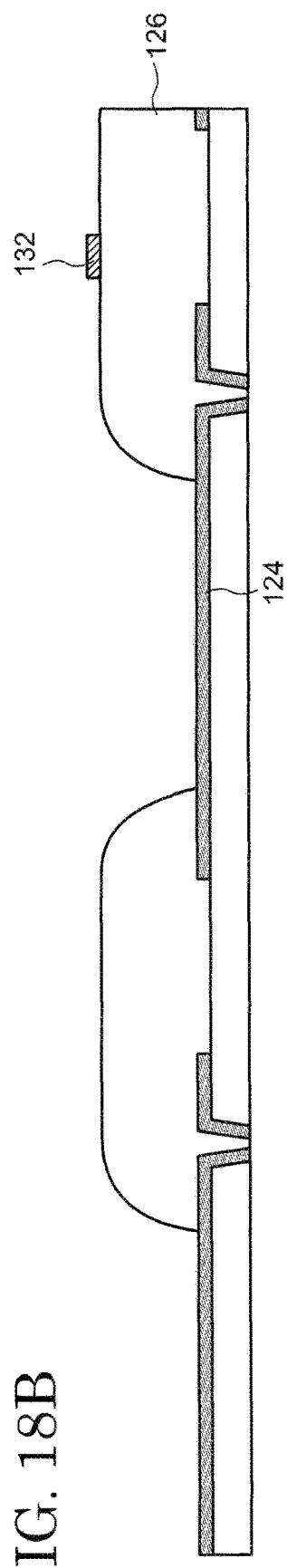
Figure 18C:
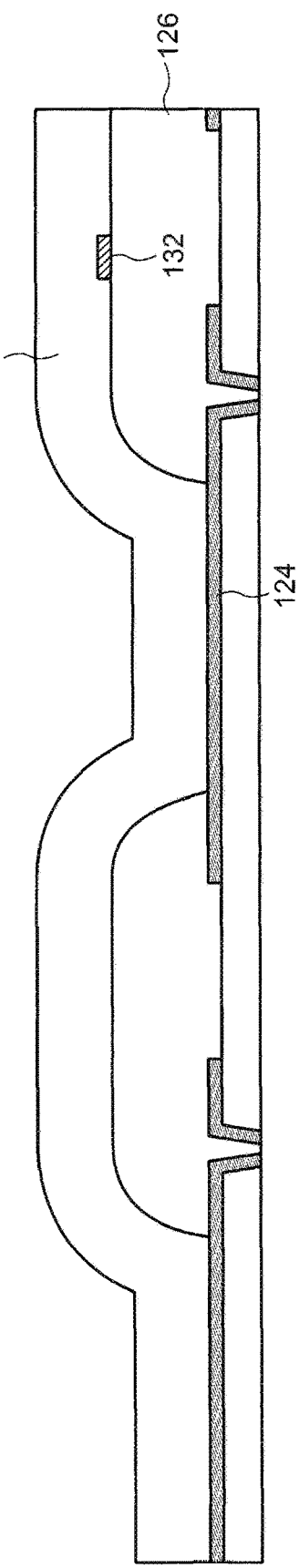
Figure 20:
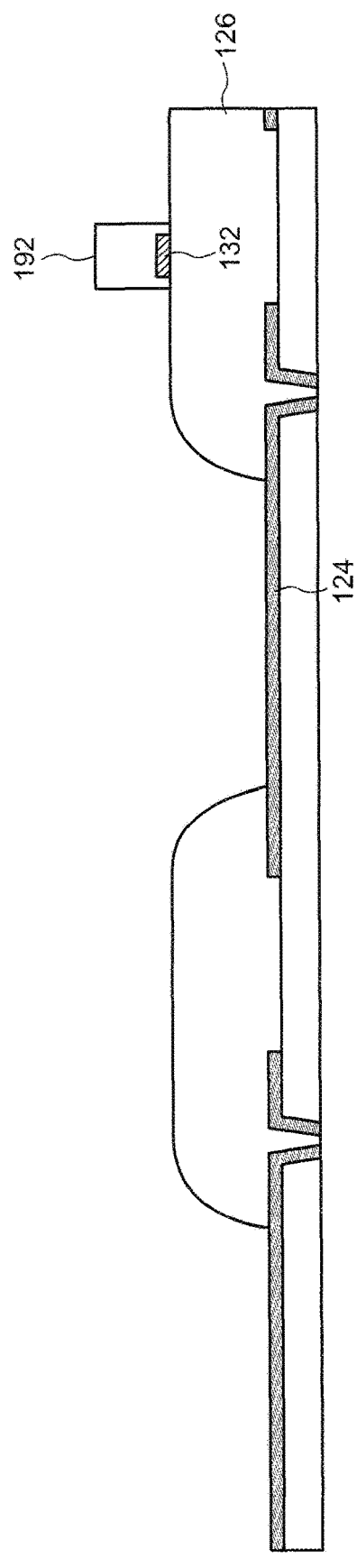
FIG. 20 is a schematic cross-sectional view showing a manufacturing method of a display device of an embodiment of the present invention.

When the structural member 130 contains an inorganic insulator, the film 190 including an inorganic insulator is formed over the pixel electrode 124, the partition wall 126, and the second conductive film 132, similar to the method described in the Second Embodiment (FIG. 18C). A resist mask 194 overlapping with the entire second conductive film 132 is sequentially formed over the film 190 including an inorganic insulator (FIG. 19A), and a part of the film 190 which is not covered by the resist mask 194 is removed by etching, resulting in the second conductive film 132 and the structural member 130 covering the second conductive film 132 (FIG. 19B).

When the structural member 130 contains an organic insulator, a resist is applied over the pixel electrodes 124, the partition wall 126, and the second conductive film 132 shown in FIG. 18B, and exposure with the use of a photomask and development are carried out to form a resist 192 covering the second conductive film 132 (FIG. 20), similar to the method described in the Second Embodiment. As described in the Second Embodiment, stabilization of the shape is conducted by performing drying, heating, and light-irradiation on the resist 192, thereby providing the second conductive film 132 and the structural member 130 covering the second conductive film 132.

The following process is the same as the process described in the Second Embodiment.

Similar to the Third Embodiment, employment of the structure shown in the present embodiment allows the formation of the second conductive film 132 with a high conductivity in a stripe shape, by which the second conductive film 132 can effectively function as one electrode of a touch panel.

<Fifth Embodiment>

In the present embodiment, a display device 400 different in structure from those of the First to Fourth Embodiments is explained by using FIG. 21 to FIG. 24B. Explanation of the structures the same as those of the First to Fourth Embodiments may be omitted.

Figure 21:
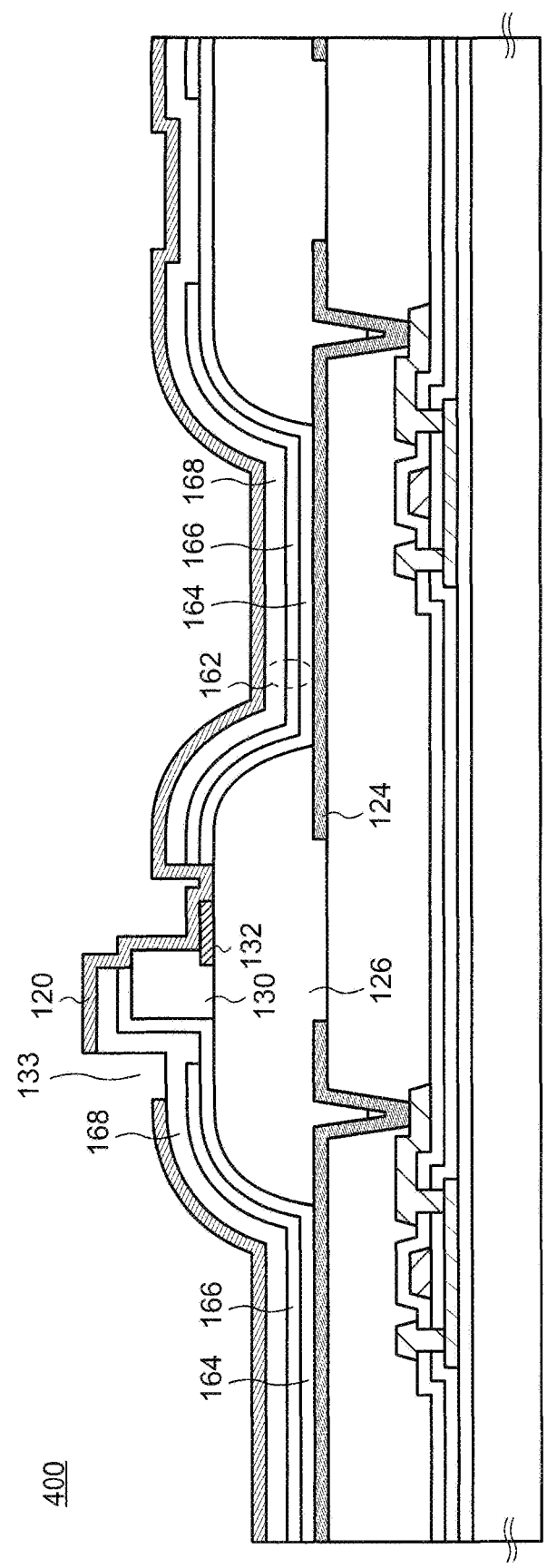
FIG. 21 is a schematic cross-sectional view of a display device of an embodiment of the present invention.

The display device 400 is different from the display device 300 in the following points: the second conductive film 132 is partly exposed from the structural member 130 and in contact with the opposing electrode 120 although the second conductive film 132 is provided under the structural member 130; a part of the partition wall 126 is exposed between the structural member 130 and the EL layer 162 and between the second conductive film 132 and the EL layer 162; and the partition wall 126 is in contact with the opposing electrode 120 at the aforementioned exposed point. Specifically, as shown in FIG. 21, the display device 400 possesses the second conductive film 132 over and in contact with the partition wall 126, and a part of the second conductive film 132 is covered by the structural member 130. In other words, a part of the second conductive film 132 is exposed from the structural member 130. Similar to the Fourth Embodiment, the structural member 130 may include an inorganic insulator or an organic insulator.

A sidewall of the structural member 130 on which the conductive film 132 is formed is covered by the opposing electrode 120. However, a part of a sidewall opposing this sidewall is not covered by the opposing electrode 120 but exposed. At the same time, a slit 133 is formed at a vicinity of the sidewall having a part which is exposed. The third layer 168 which is the upmost layer of the EL layer 162 is exposed from the opposing electrode 120 in the slit 133. Hence, the adjacent opposing electrodes 120 are electrically independent from each other due to the slit 133.

The second conductive film 132 and the structural member 130 with such a structure can be fabricated with a method shown in FIG. 22A to FIG. 23. Specifically, as described in the Fourth Embodiment, the second conductive film 132 is formed over the partition wall 126 (FIG. 22A). When the structural member 130 contains an inorganic insulator, the film 190 containing an inorganic insulator is formed so as to cover the pixel electrode 124, the partition wall 126, and the second conductive film 132. A resist mask 194 overlapping with a part of the second conductive film 132 is sequentially formed over the film 190 containing an inorganic insulator (FIG. 22B), and a part of the film 190 which is not covered by the resist mask 194 is removed with etching, thereby forming the second conductive film 132 and the structural member 130 partly covering the second conductive film 132 (FIG. 22C).

Although not shown, when the structural member 130 contains an organic insulator, a resist is applied over the pixel electrode 124, the partition wall 126, and the second conductive film 132 shown in FIG. 22A, the resist is exposed using of a photomask, and the resist is developed to form the resist partly covering the second conductive film 132, similar to the method described in the Second Embodiment. In this case, stabilization of the shape is conducted by performing drying, heating, and light irradiation on the resist as described in the Second Embodiment, forming the second conductive film 132 and the structural member 130 covering the second conductive film 132.

Inclination evaporation is performed on the thus obtained substrate 102. During inclination evaporation, the substrate 102 is installed in an evaporation chamber so that the surface over which the pixel electrodes 124 and the structural members 130 are formed faces downward and that the substrate 102 is inclined from the horizontal plane as shown in FIG. 23. An evaporation source 210 such as a crucible or a boat including a material to be evaporated therefrom is placed under the substrate 102, and the material is evaporated to conduct film formation. At this time, one of or both of the evaporation source 210 and the substrate 102 may be relatively moved in a direction parallel to the surface of the substrate 102 (along a direction indicated by an arrow) in order to keep a distance between the evaporation source 210 and the substrate 102 surface constant.

First, the EL layer 162 is formed by inclination evaporation by which vapor of the material providing the EL layer 162 is brought close to the substrate 102 in an inclined direction as shown in FIG. 24A. With this procedure, the formation of the EL layer 162 can be avoided in a region behind the structural member 130, that is, on a side surface of the structural member 130 on a side where the second conductive film 132 is exposed, on an exposed surface of the second conductive film 132, and on a part of the partition wall 126 which is opposite to the structural member 130 with respect to the second conductive film 132.

Next, the opposing electrodes 120 are formed by inclination evaporation. In this case, as shown in FIG. 24B, the angle of the substrate 102 is changed so that vapor of the material to be included in the opposing electrodes 120 is brought close to the substrate 102 in a direction facing the direction of the vapor of the material included in the EL layer 162. With this procedure, the opposing electrodes 120 are not formed on the EL layer 162 formed on a side surface of the structural member 130 which is opposite to the side where the second conductive film 132 is exposed and at a vicinity thereof. However, the opposing electrodes 120 are formed in a region where the EL layer 162 is not formed, that is, on the side surface of the structural member 130 on a side where the second conductive film 132 is exposed, on the exposed surface of the second conductive film 132, and on the part of the partition wall which is opposite to the structural member 130 with respect to the second conductive film 132. Note that, the second conductive film 132 is electrically connected to the opposing electrode 120 at this stage. As described above, the EL layer 162 and the opposing electrodes 120 are evaporatively deposited in different directions, by which the plurality of opposing electrodes 120 can be electrically independent from one another.

Similar to the First Embodiment, employment of the structure shown in the present embodiment allows the opposing electrodes 120 electrically independent from one another to be used as one electrode of a touch panel. When a conductivity of a material used in the opposing electrode 120 is not sufficiently high, an increase in size of display region 106 causes a voltage drop in the opposing electrodes 120. As a result, it becomes difficult to provide a uniform potential between the pixel electrodes 124 and the opposing electrodes 120 in the entire display region 106, and a uniform luminance cannot be obtained in the display region 106. However, the second conductive films 132 are able to possess a high conductivity because they can be prepared as metal films having a sufficient thickness. Additionally, similar to the opposing electrodes 120, arrangement of the second conductive films 132 in a stripe shape and electrical connection with the opposing electrodes 120 enable the second conductive films 132 to function as auxiliary electrodes. Accordingly, the voltage drop can be avoided, and a high-quality display can be realized.

<Sixth Embodiment>

Figure 25:
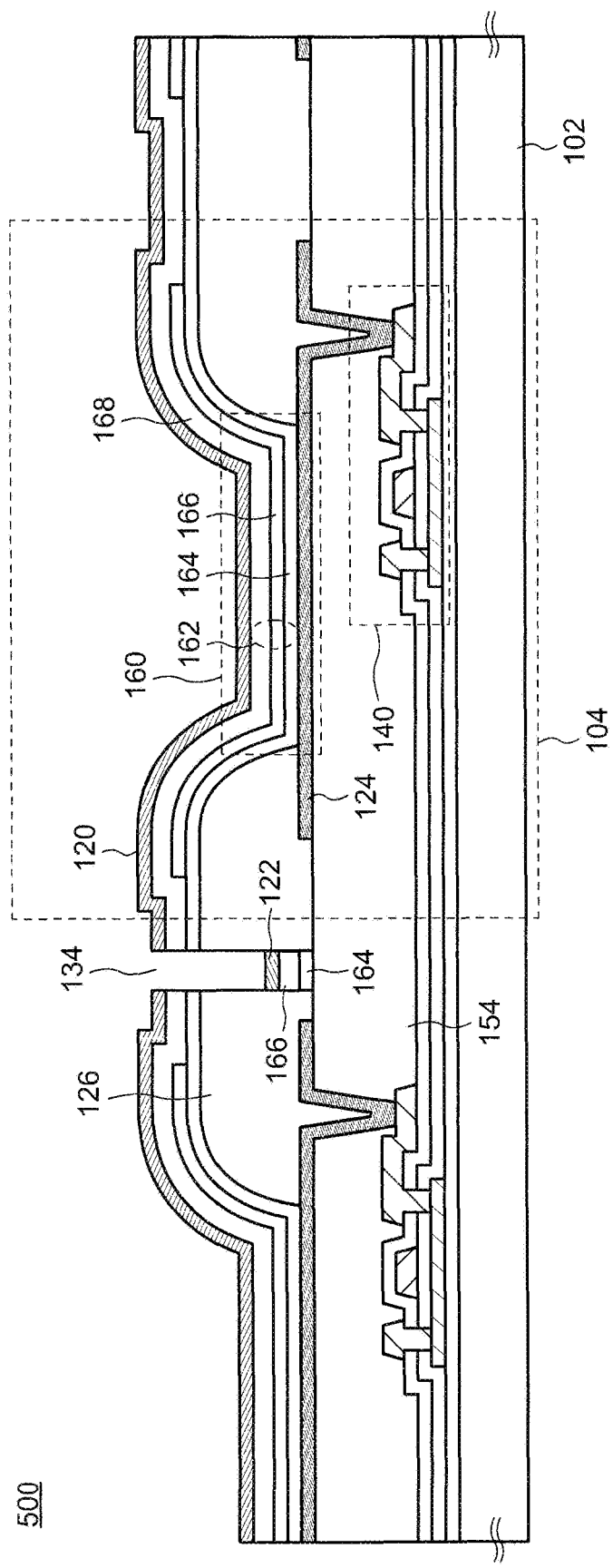
FIG. 25 is a schematic cross-sectional view of a display device of an embodiment of the present invention.
Figure 26A:
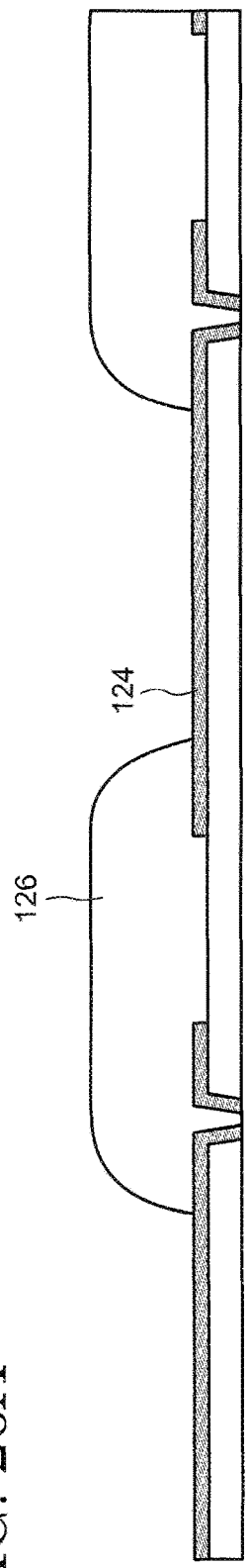
FIG. 26A to FIG. 26C are schematic cross-sectional views showing a manufacturing method of a display device of an embodiment of the present invention.
Figure 26B:
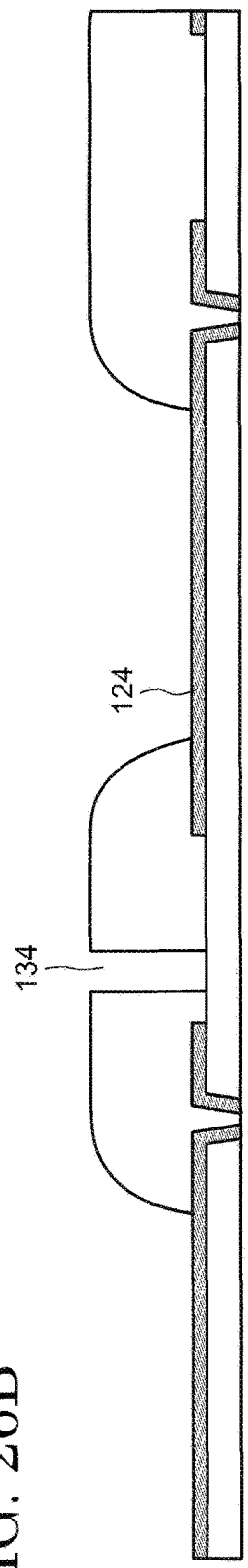
Figure 26C:
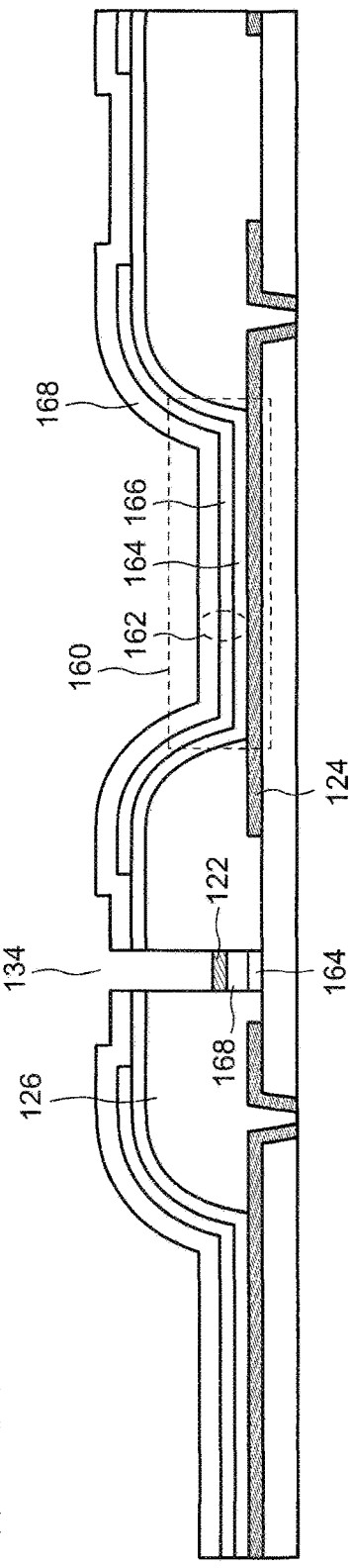

In the present embodiment, a display device 500 different in structure from those of the First to Fifth Embodiments is explained by using FIG. 25 to FIG. 26C. Explanation of the structures the same as those of the First to Fifth Embodiments may be omitted.

The display device 500 is different from the display devices 100, 200, 300, and 400 in that a trench 134 is formed in the partition wall 126 instead of the formation of the structural member 130 and that all of or a part of the EL layer 162 and the first conductive film 122 are arranged in the trench 134.

More specifically, the display device 500 has the trench 134 in the partition wall 126. The trench 134 can be formed every several or several tens of pixels 104. The trench 134 may reach the leveling film 154 as shown in FIG. 25, or a bottom surface thereof may be left in the partition wall 126. Furthermore, the trench 134 may be provided so as to expose the pixel electrode 124.

A part of or all of the EL layer 162 is disposed in the trench 134. In FIG. 25, an example is shown in which the first layer 164 and the third layer 168 of the EL layer 162 are provided in the trench 134.

The first conductive film 122 is further formed over a part of or all of the EL layer 162 in the trench 134. As described below, this first conductive film 122 is formed simultaneously with the opposing electrode 120. Therefore, the first conductive film 122 and the opposing electrode 120 exist in the same layer. The first conductive film 122 and the opposing electrode 120 are disconnected due to a step caused by the trench 134 and are electrically independent.

Such a structure can be fabricated by the following method. That is, similar to the method described in the Second Embodiment, the structures up to the partition wall 126 are formed (FIG. 26A). After that, a resist mask having an opening in a region where the trench 134 is to be formed is prepared, and etching is performed on the opening, thereby forming the trench 134 (FIG. 26B). It is preferred that a side surface of the trench 134 be perpendicular to an upper surface of the substrate 102. Hence, the trench 134 is preferably formed with dry etching. Note that the trench 134 is formed so as to extend in a direction parallel to a side of the display region 106.

After that, similar to the Second Embodiment, the EL layer 162 is formed (FIG. 26C) over which a conductive film is formed. The conductive film is disconnected by the trench 134 because the conductive film is hardly formed on a side surface of the trench 134. As a result, the adjacent opposing electrodes 120 are electrically independent from each another (FIG. 25).

Similar to the First Embodiment, the opposing electrodes 120 function not only as one electrode of the light-emitting elements 160 but also as one electrode of a touch panel. Therefore, it is possible to supply a display device which is installed with an in-cell type touch panel and manufactured with a simple process at low cost.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
   a plurality of pixel electrodes;
   a first insulating film located over the plurality of pixel electrodes and covering edges of the plurality of pixel electrodes;
   a plurality of opposing electrodes over the plurality of pixel electrodes and the first insulating film, the plurality of opposing electrodes being arranged in a stripe shape;
   an EL layer sandwiched between the plurality of pixel electrodes and the plurality of opposing electrodes and covering the first insulating film;
   a plurality of insulating structural members over and in contact with the first insulating film, the plurality of insulating structural members being each sandwiched by and in contact with two adjacent opposing electrodes; and
   a plurality of metal films located over the plurality of insulating structural members and arranged in a stripe shape alternately with the plurality of opposing electrodes,
   wherein the plurality of opposing electrodes is each in contact with the EL layer and electrically independent from one another and from the plurality of metal films, and
   a gap is formed by the plurality of insulating structural members in a thickness direction of the plurality of pixel electrodes between one of the metal films and one of the opposing electrodes adjacent to the one of the metal films.

2. The display device according to claim 1, wherein each of the plurality of opposing electrodes overlaps with multiple pixel electrodes of the plurality of pixel electrodes.

3. The display device according to claim 1, wherein a width of each of the plurality of metal films is smaller than a width of each of the plurality of opposing electrodes.

4. The display device according to claim 1, further comprising:
   a second insulating film over the plurality of opposing electrodes and the plurality of metal films; and
   a plurality of electrodes over the second insulating film,
   wherein the plurality of electrodes is arranged in a stripe shape and intersects with the plurality of opposing electrodes and the plurality of metal films.

* * * * *